(12) United States Patent
Iijima et al.

(10) Patent No.: US 7,826,918 B2
(45) Date of Patent: Nov. 2, 2010

(54) TRANSFER SYSTEM AND TRANSFER METHOD OF OBJECT TO BE PROCESSED

(75) Inventors: Toshihiko Iijima, Nirasaki (JP); Shinya Shimizu, Nirasaki (JP); Kaori Ishihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/374,998

(22) Filed: Mar. 15, 2006

(65) Prior Publication Data

US 2006/0152211 A1 Jul. 13, 2006

Related U.S. Application Data

(63) Continuation of application No. PCT/JP2004/013537, filed on Sep. 16, 2004.

(30) Foreign Application Priority Data

Sep. 17, 2003 (JP) ............................. 2003-324619

(51) Int. Cl.
*G06F 7/00* (2006.01)
(52) U.S. Cl. .................. 700/214; 414/935; 700/218
(58) Field of Classification Search ................. 700/213, 700/214, 218; 414/935, 937, 939–941
See application file for complete search history.

(56) References Cited

U.S. PATENT DOCUMENTS

| | | | | |
|---|---|---|---|---|
| 4,698,775 | A * | 10/1987 | Koch et al. | .................. 700/218 |
| 4,789,294 | A * | 12/1988 | Sato et al. | .............. 414/416.03 |
| 5,431,600 | A * | 7/1995 | Murata et al. | ................ 454/187 |
| 5,617,945 | A | 4/1997 | Takahashi et al. | |
| 5,742,173 | A * | 4/1998 | Nakagomi et al. | .......... 324/758 |
| 5,853,486 | A * | 12/1998 | Ono et al. | ................... 118/719 |
| 6,175,777 | B1 * | 1/2001 | Kim | ........................... 700/121 |
| 6,665,595 | B1 * | 12/2003 | Goto et al. | ..................... 701/23 |
| 7,078,262 | B2 * | 7/2006 | Yamamoto et al. | .......... 438/106 |
| 2002/0154974 | A1 | 10/2002 | Fukuda et al. | |
| 2003/0023343 | A1 | 1/2003 | Tomita et al. | |
| 2004/0046545 | A1 | 3/2004 | Akiyama et al. | |
| 2004/0052624 | A1 | 3/2004 | Miyano et al. | |
| 2004/0234362 | A1 | 11/2004 | Iijima et al. | |
| 2004/0240971 | A1 * | 12/2004 | Tezuka et al. | ............... 414/217 |

FOREIGN PATENT DOCUMENTS

| | | |
|---|---|---|
| JP | 7-78858 | 3/1995 |
| JP | 7-315565 | 12/1995 |
| JP | 2002-217263 | 8/2002 |
| KR | 2003-0066773 | 8/2003 |

\* cited by examiner

*Primary Examiner*—Gene Crawford
*Assistant Examiner*—Ramya Prakasam
(74) *Attorney, Agent, or Firm*—Oblon, Spivak, McClelland, Maier & Neustadt, L.L.P.

(57) ABSTRACT

A transfer method employs a transfer system including a semiconductor handling device and an automatic transfer device. The semiconductor handling device includes a first transfer mechanism and a first optically coupled parallel I/O communications interface. The automatic transfer device includes a second transfer mechanism and a second optically coupled parallel I/O communications interface. The transfer method includes a successive transfer notifying step wherein the automatic transfer device and the semiconductor handling device notify each other that a successive transfer is possible via an optical communications between the first and the second optically coupled parallel I/O communications interface in case where a plurality of objects to be processed are able to be successively transferred one by one between the first and the second transfer mechanism; and a successive transfer step wherein the objects are transferred one by one between the first and the second transfer mechanism.

13 Claims, 16 Drawing Sheets

FIG.4
BIT ASSIGNMENT OF OPTICAL DEVICE
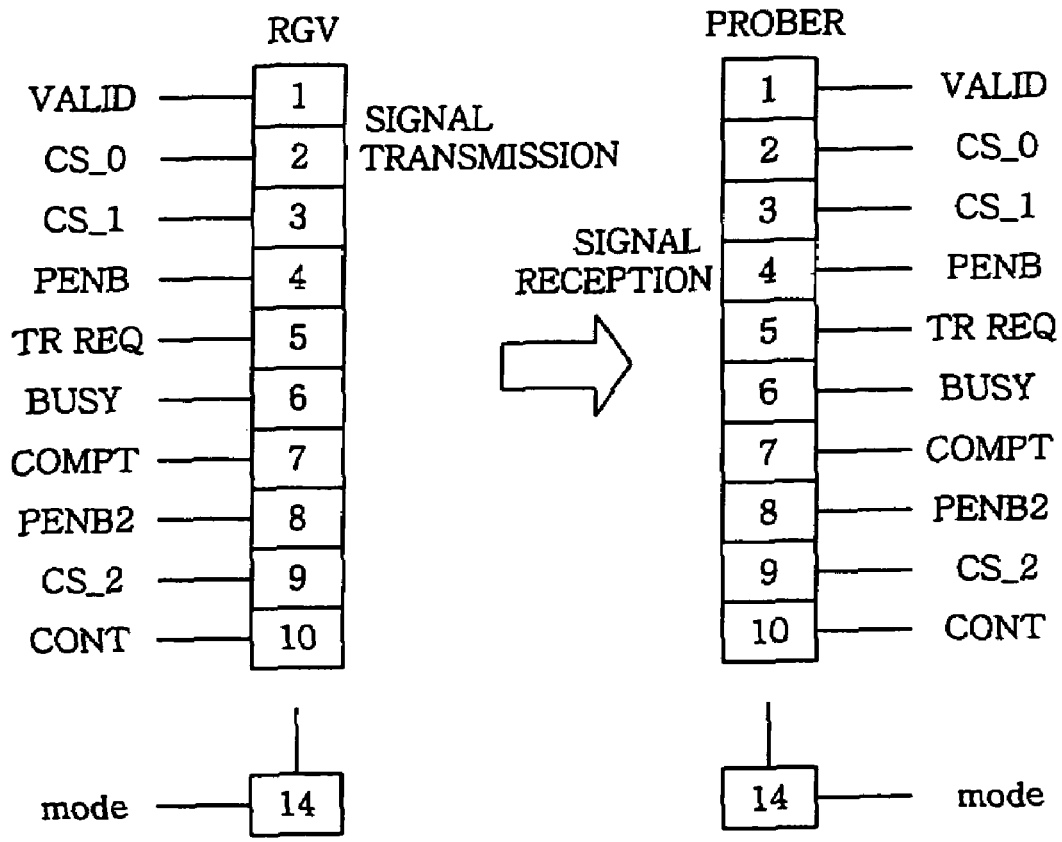
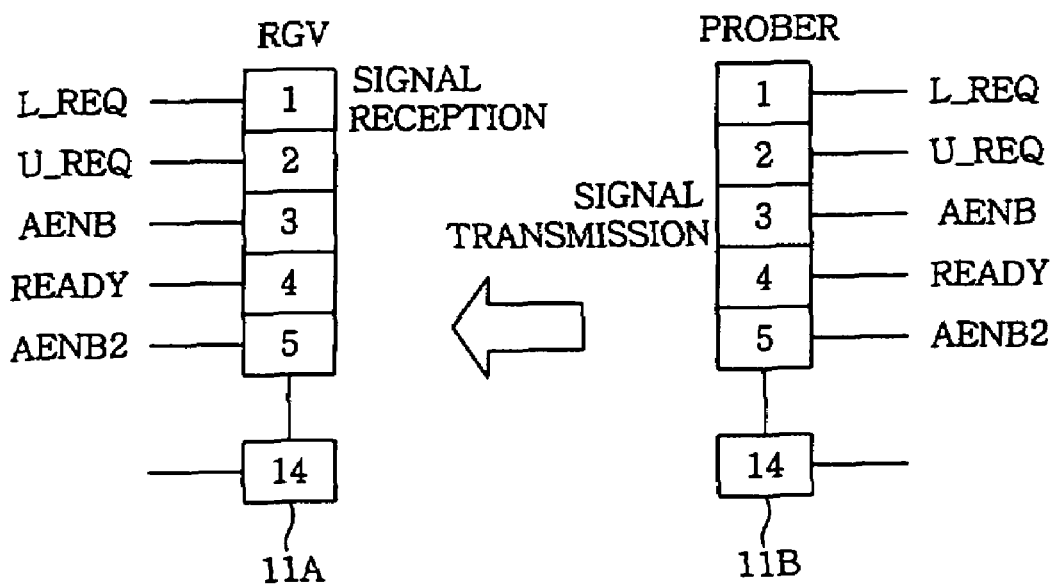

NOTE: ( ): a singal from RGV to PROBER or STOCKER.
      < >: a case of STOCKER.
      [ ]: RGV action   *: PROBER action
      (where, STOCKER is also required to response.)
      Thick line and thin line of [ARM] denote ON
      and OFF of vacuum, respectively.
      T, T6, T7, T9: monitoring time by PROBER
      TR_REQ~AENB2 are set at the same timing as driving of ARM θ/Z

TRANSFER SYSTEM AND TRANSFER METHOD OF OBJECT TO BE PROCESSED

This application is a Continuation Application of PCT International Application No. PCT/JP04/013537 filed on Sep. 16, 2004, which designated the United States.

FIELD OF THE INVENTION

The present invention relates to a system and a method for transferring objects to be processed; and more particularly, to a system and method for transferring objects to be processed capable of enhancing a transfer efficiency per a single wafer.

BACKGROUND OF THE INVENTION

For example, in an inspection process for semiconductor devices, a prober has been widely used as a device for inspecting semiconductor wafers (hereinafter, simply referred to as "wafers"). Generally, the prober includes a loader chamber and a prober chamber to inspect electrical characteristics of the wafers.

The loader chamber has a carrier mounting unit for mounting thereon a carrier accommodating therein a plurality of wafers (e.g., 25 wafers), a wafer transfer mechanism (hereinafter, referred to as "arm mechanism") for unloading the wafers from the carrier of the carrier mounting unit one by one, and a pre-alignment mechanism (hereinafter, referred to as "sub-chuck") for aligning in advance the wafer transferred through the arm mechanism. With such arrangements, the wafers in the carrier are unloaded one by one through the arm mechanism and pre-aligned; and then transferred into the prober chamber.

The prober chamber has a mounting table (hereinafter, referred to as "main chuck"), moving along X, Y, Z and θ directions, for mounting thereon the wafers, an aligning mechanism for cooperating with the main chuck to align the wafers, a probe card disposed above the main chuck, and a test head interposed between the probe card and the tester. A number of probes of the probe card make contacts with an aligned wafer to inspect electrical characteristics thereof. Thereafter, the wafer is returned to the original place in the carrier from the prober chamber through the arm mechanism of the loader chamber.

In case of inspecting the wafer, an operator carries a carrier accommodating therein wafers to the carrier mounting unit of the loader chamber onto the carrier mounting unit. However, in case of a large diameter wafer of, e.g., a 300 mm wafer, the carrier accommodating therein a plurality of wafers is very heavy, thereby making it very difficult for the operator to carry such a carrier. Thus, there has been proposed in Japanese Patent Laid-open Publication No. H10-303270 a transfer method capable of transferring each carrier accommodating therein wafers of a same lot between an automatic transfer carriage and a processing equipment by using the automatic transfer carriage. In such transfer method, it is not required for the operator to carry the carrier; and therefore, the aforementioned problem can be resolved.

Meanwhile, with a recent trend towards a large diameter of the wafer and an ultra miniaturization of devices, the number of devices formed on a single wafer is significantly increased, so that much time is needed to complete a processing such as an inspection for a single wafer. For the reason, although the wafers of a same lot in a carrier can be transferred to a semiconductor manufacturing device such as an inspection device by using the automatic transfer carriage as described above, it takes considerably long time to process all the wafers in the carrier, and even wafers already processed have to stay in the semiconductor manufacturing device during such a process period. As a result, a subsequent processing for the wafers of the same lot is delayed, so that it is difficult to shorten a Turn-Around-Time (TAT).

To that end, the inventors have proposed a transfer system and method for transferring objects to be processed by using an optically coupled parallel input/output (I/O) communications in Japanese Patent Laid-open Publication No. 2002-217263. By this, it is possible to secure a transfer of objects to be processed, e.g., wafers, one by one between a first transfer mechanism of a plurality of semiconductor manufacturing devices and a second transfer mechanism of an automatic transfer device. Moreover, it is possible to parallel-process a plurality of objects to be processed by using the plurality of semiconductor manufacturing devices, resulting in a reduction of TAT for the objects to be processed.

In the transfer system and method disclosed in Japanese Patent Laid-open Publication No. 2002-217263, optical communications are carried out between the automatic transfer device and the semiconductor manufacturing device to actuate the first and the second transfer mechanism, thereby accurately and securely transferring the objects to be processed one by one. However, even in case where, e.g., two sheets of the objects to be processed may be consecutively transferred depending on an operation status of the semiconductor manufacturing device, the second transfer mechanism of the automatic transfer device cannot perform the transfer of the objects to be processed consecutively. For the above reason, a transfer efficiency of the objects cannot be always good. Further, since a sequence, control signal is transmitted via the optical communications between the automatic transfer device and the semiconductor manufacturing device to sequentially control the first and the second transfer mechanism, the communications are frequently carried out and a reduction in the communications time is limited.

SUMMARY OF THE INVENTION

It is, therefore, an object of the present invention to provide a transfer system and method for transferring objects to be processed capable of enhancing a transfer efficiency between an automatic transfer device and a processing equipment to thereby reduce a TAT of the object to be processed. Further, it is another object of the present invention to provide a transfer system and method for transferring objects to be processed capable of improving a communications efficiency between an automatic transfer device and a processing equipment.

In accordance with one aspect of the present invention, there is provided a system for transferring objects to be processed, the system including: a plurality of semiconductor handling devices; and an automatic transfer device for automatically transferring the objects to be processed one by one between the plurality of semiconductor handling devices, wherein each of the semiconductor handling devices includes a first transfer mechanism and a first optically coupled parallel input/output (I/O) communications interface, the automatic transfer device includes a second transfer mechanism and a second optically coupled parallel I/O communications interface, the first and the second transfer mechanism are configured to successively transfer the objects to be processed one by one to each other, and the first and the second optically coupled parallel I/O communications interface transmit and receive therebetween optical signals as control signals to control the first or the second transfer mechanism.

In accordance with the present invention, the transfer efficiency between the plurality of semiconductor handling devices and the automatic transfer device is increased, thereby shortening a TAT of the objects to be processed.

For example, the semiconductor handling device is a semiconductor manufacturing device, a semiconductor inspection device or a semiconductor accommodating device.

In accordance with another aspect of the present invention, there is provided a method for transferring objects to be processed, which employs a system for transferring the object to be processed, the system including: a semiconductor handling device provided with a first transfer mechanism and a first optically coupled parallel input/output (I/O) communications interface; and an automatic transfer device provided with a second transfer mechanism and a second optically coupled parallel I/O communications interface, wherein the first and the second transfer mechanism are configured to successively transfer the objects to be processed one by one to each other, and the first and the second optically coupled parallel I/O communications interface transmit and receive therebetween optical signals as control signals to control the first or the second transfer mechanism, wherein the method includes: a successive transfer notifying step wherein the automatic transfer device and the semiconductor handling device notify each other that a successive transfer is possible via an optical communications between the first and the second optically coupled parallel I/O communications interface in case where the plurality of objects to be processed can be successively transferred one by one between the first and the second transfer mechanism; and a successive transfer step wherein the objects to be processed are transferred one by one between the first and the second transfer mechanism.

In accordance with the present invention, the transfer efficiency between the semiconductor handling device and the automatic transfer device is increased, thereby shortening the TAT of the objects to be processed.

Preferably, the transfer method further includes: a transfer initiation notifying step wherein the automatic transfer device notifies the semiconductor handling device of a transfer initiation via the optical communications between the first and the second optically coupled parallel I/O communications interface when the successive transfer step is initiated; an access confirming step wherein, after the transfer initiation notifying step, it is checked whether or not the first transfer mechanism is accessible by the second transfer mechanism based on a presence or absence of the object to be processed in the first transfer mechanism; an access confirmation notifying step wherein the semiconductor handling device notifies the automatic transfer device of the result in the access confirming step via the optical communications between the first and the second optically coupled parallel I/O communications interface; and an accessing step wherein, after the access confirmation notifying step, the second transfer mechanism gains access to the first transfer mechanism based on the result of the access confirming step.

Further, at the successive transfer notifying step, the automatic transfer device notifies the semiconductor handling device that the successive transfer is possible, and the successive transfer notifying step and the transfer initiation notifying step are substantially simultaneously conducted.

Preferably, the transfer method further includes: a retreat confirming step wherein, after the accessing step, it is checked whether or not the second transfer mechanism is able to be retreated from the first transfer mechanism based on presence or absence of the object to be processed in the first transfer mechanism; a retreat confirmation notifying step wherein the semiconductor handling device notifies the automatic transfer device of the result in the retreat confirming step via the optical communications between the first and the second optically coupled parallel I/O communications device; a retreating step wherein, after the retreat confirmation notifying step, the second transfer mechanism is retreated from the first transfer mechanism based on the result of the retreat confirming step; and a transfer completion notifying step wherein, after the retreating step, the automatic transfer device notifies the semiconductor handling device of completion of the transfer via the optical communications between the first and the second optically coupled parallel I/O communications interface.

At the successive transfer step, the transferring of the object to be processed from the second transfer mechanism to the first transfer mechanism may be repeated. Further, at the successive transfer step, the transferring of an object to be processed from the first transfer mechanism to the second transfer mechanism and the transferring of another object to be processed from the second transfer mechanism to the first transfer mechanism may be successively carried out.

BRIEF DESCRIPTION OF THE DRAWINGS

The above and other objects and features of the present invention will become apparent from the following description of preferred embodiments given in conjunction with the accompanying drawings, in which:

FIG. 4 illustrates a configuration diagram showing a PIO communications interface for use in a PIO communications of the transfer system shown in FIG. 1;

DETAILED DESCRIPTION OF THE PREFERRED EMBODIMENTS

Hereinafter, preferred embodiments of the present invention will be described with reference to the accompanying drawings.

Figure 1A:
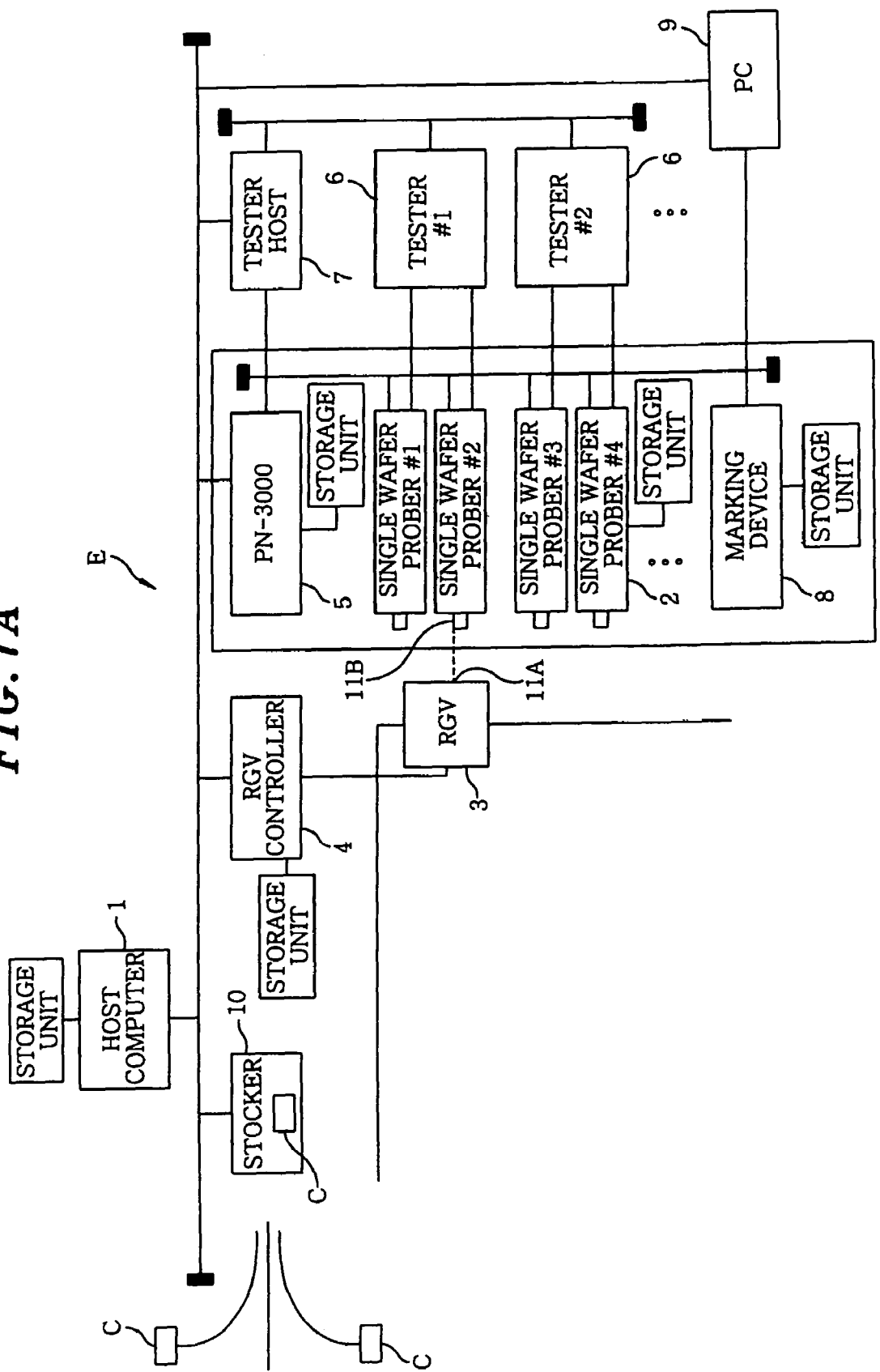
FIG. 1A offers a schematic block diagram showing a first embodiment of a transfer system for transferring objects to be processed in accordance with the present invention.
Figure 1B:
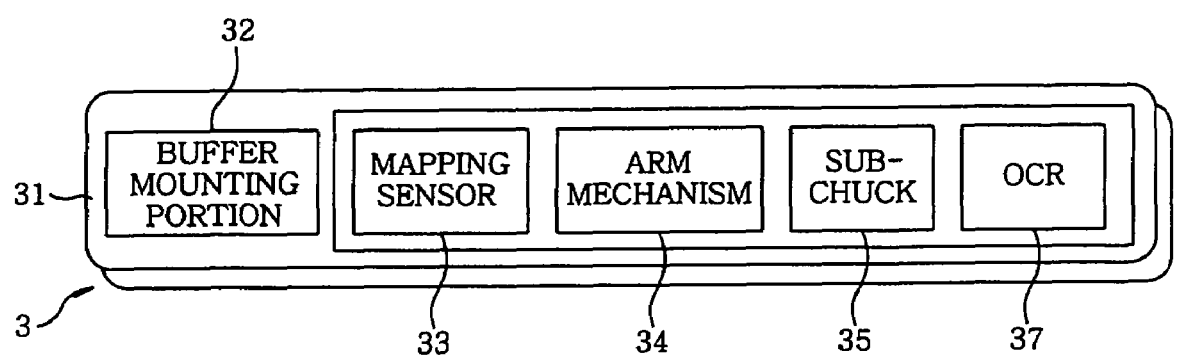
FIG. 1B presents a schematic view showing a configuration of an RGV.

As shown in FIGS. 1A and 1B, an Automated Material Handling System (AMHS) E for transferring objects to be processed in accordance with a first embodiment of the present invention includes a host computer 1 for managing an overall factory production process containing an inspection process for wafers (not shown) as the objects to be processed; a plurality of probers 2 as an inspection device for inspecting electrical characteristics of the wafers under the management of the host computer 1; a plurality of automatic transfer devices (hereinafter, referred to as "RGV") for automatically transferring the wafers to the probers 2 one by one in response to respective demands, and a transfer control device (hereinafter, referred to as "RGV controller") for controlling the RGV's 3. The probers 2 and the RGV's 3 include optically coupled parallel I/O (hereinafter, referred to as "PIO") communications interfaces based on SEMI standard E23 or E84, wherein the wafers W are transferred one by one while performing the PIO communications between the probers 2 and the RGV's 3. Each prober 2 is configured as a single wafer type prober 2 for receiving and inspecting the wafers W sheet by sheet. An RGV controller 4 is connected to the host computer 1 via a Semiconductor Equipment communications Standard (SECS) communications line to control the RGV's 3 under the management of the host computer 1 via wireless communications and at the same time manage the wafer W of a same lot.

Further, the plurality of probers 2, as shown in FIG. 1A, is connected to the host computer 1 via a group controller 5 and also the SECS communications line. Therefore, the host computer 1 manages the plurality of the probers 2 via the group controller 5. The group controller 5 manages inspection information such as recipe data and log data of the probers 2.

And also, the probers 2 are connected to corresponding testers 6 through the SECS communications line, respectively, and each of the probers 2 individually performs a specific inspection in response to an instruction from the corresponding tester 6. These testers 6 are connected with the host computer 1 via a tester host computer (hereinafter, referred to as "tester host") 7 and also the SECS communications line. Hence, the host computer 1 manages the plurality of the testers 6 through the tester host 7.

Furthermore, a marking device 8 for carrying out a predetermined marking based on an inspection result of the wafer is connected with the host computer 1 through a marking instruction device 9. The marking instruction device 9 is configured to instruct the marking device 8 to conduct a marking based on the data of the tester host 7.

Moreover, a stocker 10 for keeping a plurality of carriers C (or cassettes) corresponding to a plurality of wafer sizes is connected to the host computer 1 through the SECS communications line. Accordingly, the stocker 10 keeps (classifies) wafers before and after inspections sheet by sheet; and loads and unloads the wafers sheet by sheet under the management of the host computer 1.

Figure 2A:
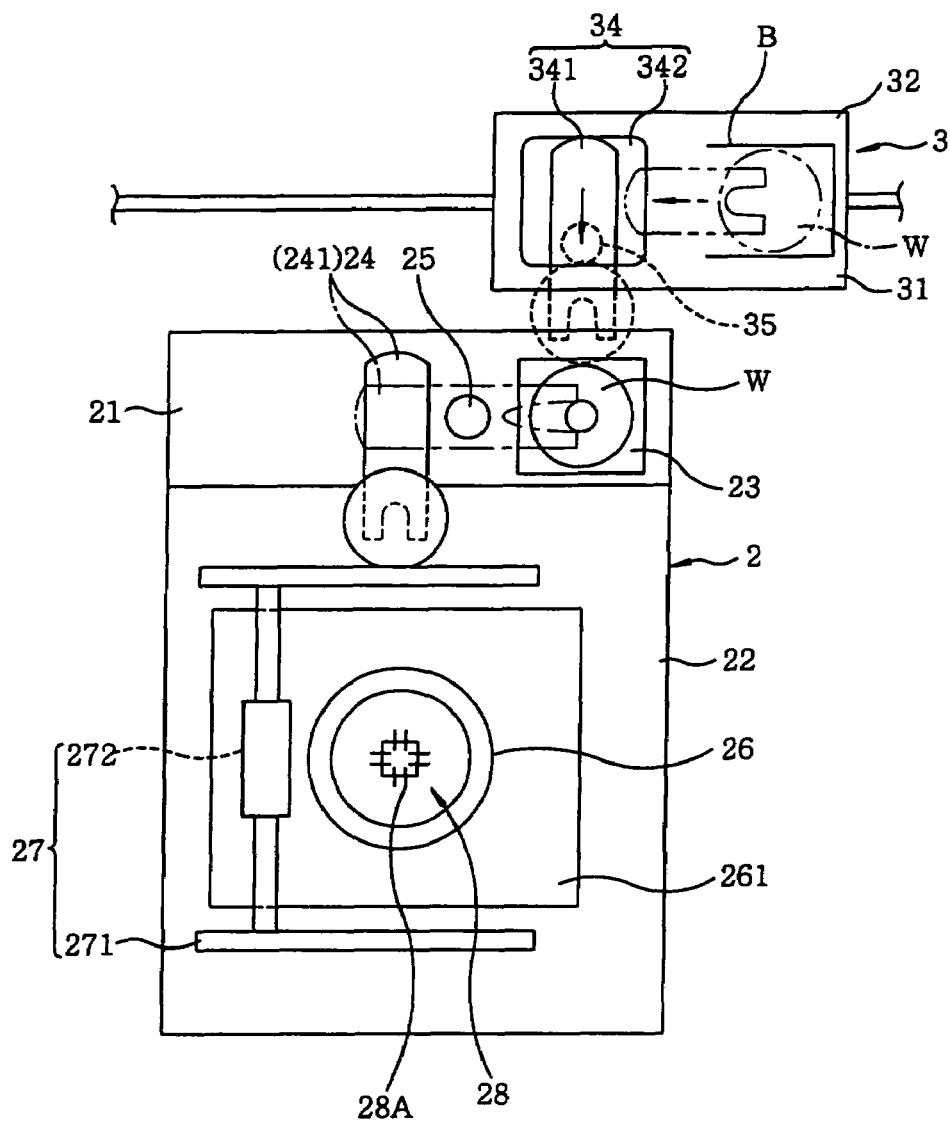
FIG. 2A shows a plane view schematically representing a state where a wafer is transferred between a prober and the RGV.

Each prober 2, as depicted in FIG. 2A, is provided with a loader chamber 21 and a prober chamber 22.

The loader chamber 21 includes an adapter 23, an arm mechanism 24 and a sub-chuck 25. Elements other than the adapter 23 are configured similarly to those of the conventional prober. The adapter 23 includes a first transfer mechanism for transferring the wafer W to the RGV 3 one by one. The arm mechanism 24 includes an upper and a lower arm 241 of two stages. Each of the arms 241 is configured to hold the wafer W by a vacuum adsorption, and release it by stopping the vacuum adsorption. Accordingly, each of the arms 241 receives the wafer W from the adapter 23 to transfer it to the prober chamber 22. The sub-chuck 25 is configured to pre-align the wafer W while the arm mechanism 24 transfers it.

The prober chamber 22 is provided with a wafer chuck (also called as a main chuck) 26, an alignment mechanism 27 and a probe card 28. The main chuck 26 is configured to be moved in X and Y directions through an X and Y table 261, and to be moved in Z and θ directions through an elevation mechanism and a θ rotation mechanism (not shown). As known in the art, the alignment mechanism 27 is provided with an alignment bridge 271, a CCD camera 272 and the like, and cooperates with the main chuck 26 to align the wafer W and the probe card 28. The probe card 28 includes a plurality of probes 281. The wafer W is connected to the tester 6 (see FIG. 1A) via a test head (not shown) by electrically contacting the probes 281 with the wafer on the main chuck 26.

The adapter 23 is provided with an elevatable sub-chuck 231 with a vacuum adsorption mechanism. When transferring and receiving the wafer W to and from the RGV's 3 or the arm mechanisms 24, the sub-chuck 231 is elevated and adsorbs the wafer W through the vacuum adsorption mechanism. More specifically, when the wafer W is transferred, the sub-chuck 231 is configured to be elevated between the arm mechanism 24 and an arm mechanism of the RGV 3 which will be described later.

Figure 2B:
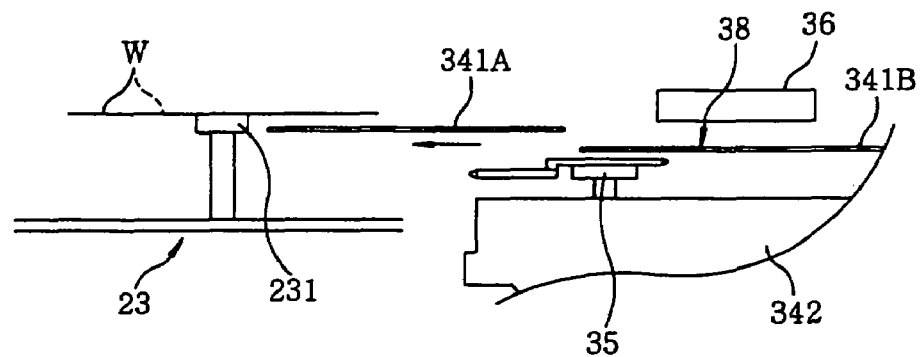
FIG. 2B sets forth a cross sectional view showing major parts of FIG. 2A.

Further, as illustrated in FIGS. 1B, 2A and 2B, the RGV 3 includes a main body 31; a buffer mounting portion 32 disposed at an end portion of the main body 31 for mounting thereon a buffer B accommodating the wafers W; a mapping sensor 33 for detecting positions of the wafers W accommodated in the buffer B mounted on the buffer mounting portion 32; an arm mechanism 34 for carrying the wafer in the buffer B; a sub-chuck 35 for aligning the wafer W in advance; an optical pre-alignment sensor 36; an optical character reader (OCR) 37 for reading an ID code (not shown) of the wafer W; a battery (not shown) used as a driving source; and a vacuum exhaust unit (not shown). Accordingly, by wireless communications with the RGV controller 4, the RGV 3 moves between the stocker 10 and the prober 2 or between the plurality of probers 2 to transfer the wafer W, and transfers the wafers W in the buffer B to the plurality of probers 2 one by one through the arm mechanism 34. Mounting units of the RGV 3 are structured similarly to those of the AGV described in Japanese Patent Laid-open Publication No. 2002-217263.

The arm mechanism 34 is a wafer transfer mechanism mounted on the RGV 3. The arm mechanism 34 is configured to be rotated and elevated during the transfer of the wafer W. Namely, as illustrated in FIGS. 2A and 2B, the arm mechanism 34 includes two stage arms 341, i.e., an upper and a lower arm 341A and 341B for vacuum adsorbing the wafer W, a clockwise and counterclockwise rotatable base 342 for supporting the two stage arms 341 such that they can be moved forward and backward, and a driving mechanism (not shown) accommodated in the base 342. As will be described later, when the wafer W is transferred, the two stage arms 341 individually move on the base 342 forward and backward through the driving mechanism; and at the same time the base 342 rotates clockwise and counterclockwise in the transfer direction of the wafer W.

Figure 3:
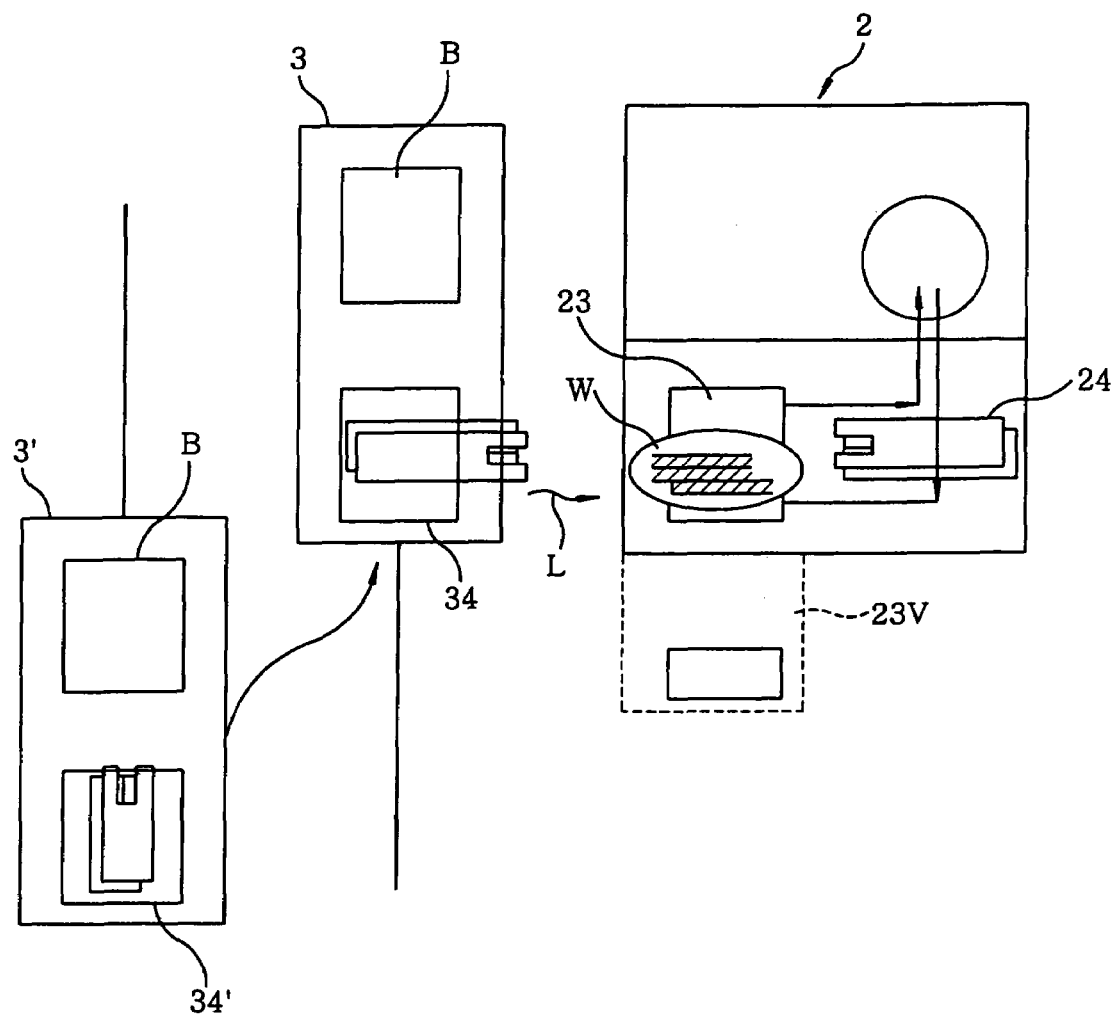
FIG. 3 is an explanatory view for explaining a transfer of the wafer in case where a virtual loading port is set in the prober.

When the RGV 3 arrives at a position where the wafer W is to be transferred to the prober 2, the arm mechanism 34 in the RGV 3 is actuated and the wafers W in the buffer B are unloaded one by one while being aligned to be positioned at the center. After taking out one wafer W from the buffer B, the arm mechanism 34 rotates by 90°, as shown in FIG. 3; and transfers the wafer W to the adapter 23 of the prober 2.

As mentioned above, since the centering of the wafer W is conducted in the RGV 3, it is unnecessary to perform the aligning of the wafer W while the wafer W is directly transferred to the main chuck 26 in the prober chamber 22 from the RGV 3. Namely, the centering of the wafer W in the RGV 3 satisfies the function of aligning the position when the wafer is directly transferred from the RGV 33 to the main chuck 26 in the prober chamber 22.

When the wafer W is transferred between the arm mechanism 34 of the RGV 3 and the adapter 23 of the prober 2, the optically coupled PIO communications are conducted between the prober 2 and the RGV 3, as mentioned above. To that end, the RGV 3 and the prober 2 include PIO communications interfaces 11A and 11B, respectively (see FIGS. 1A and 4) to exactly carry out the transfer of one wafer W by using the PIO communications with each other. The RGV 3 includes signal lines for controlling a vacuum adsorption mechanism (not shown) of the arm mechanism 34 and signal lines for controlling the upper and the lower arm 341A and 341B, in addition to a communications line regulated by conventional SEMI standards.

As described above, the prober 2 includes one adapter 23 (hereinafter, referred to as "real loading port", if necessary) as a loading port for transferring the wafer W. Further, in the present embodiment, as illustrated in FIG. 3, at least one software virtual loading port 23V other than the real loading port 23 is set in the prober 2. For example, an unloading arm 241 or an unloading table (not shown) serves as the software virtual loading port 23V. Namely, in case where an inspected wafer W is present in the prober 2 as illustrated in FIG. 3 when the wafer W is transferred from the RGV 3 thereto, loading port numbers of the signal lines of the PIO communications interfaces 11A and 11B shown in FIG. 4 in the software are converted by using the PIO communications by an optical signal L to designate the software virtual loading port 23V. Accordingly a new wafer W can be loaded into the prober 2 even when the inspected wafer W is already present in the prober 2.

For example, if the virtual loading port 23V of the prober 2 is designated, the inspected wafer W is kept therein, and the adapter 23 waits for a next wafer W. As described above, since the virtual loading port 23V is installed, it is possible to fully utilize the unloading arm 241 or the unloading table (not shown), improving a throughput. Moreover, it is not required to prepare an additional real loading port, thereby preventing an increase in foot print and cost.

However, as illustrated in FIG. 4, a transfer system E in accordance with the present embodiment includes independent PIO communications interfaces 11A and 11B for exactly transferring the wafer W between the arm mechanism 34 of the RGV 3 and the adapter 23 of the prober 2. Each of the PIO communications interfaces 11A and 11B includes a 14 bit interface with 14 ports, and a plurality of signals shown in the same drawing is allocated from the first bit port to the tenth bit port, as illustrated in FIG. 4. That is, optical signals (an AENB signal, an AENB2 signal, a PENB signal, a PENB2 signal and the like, which will be described later) are allocated to some of the bit ports in order to control the sub-chuck 231 of the adapter 23 and the arm mechanism 34 of the RGV 3.

A method for transferring the wafer W between the RGV 3 and the prober 3 by using the PIO communications through the PIO communications interfaces 11A and 11B will be described with reference to timing charts shown in FIGS. 5 to 15.

Figure 5:
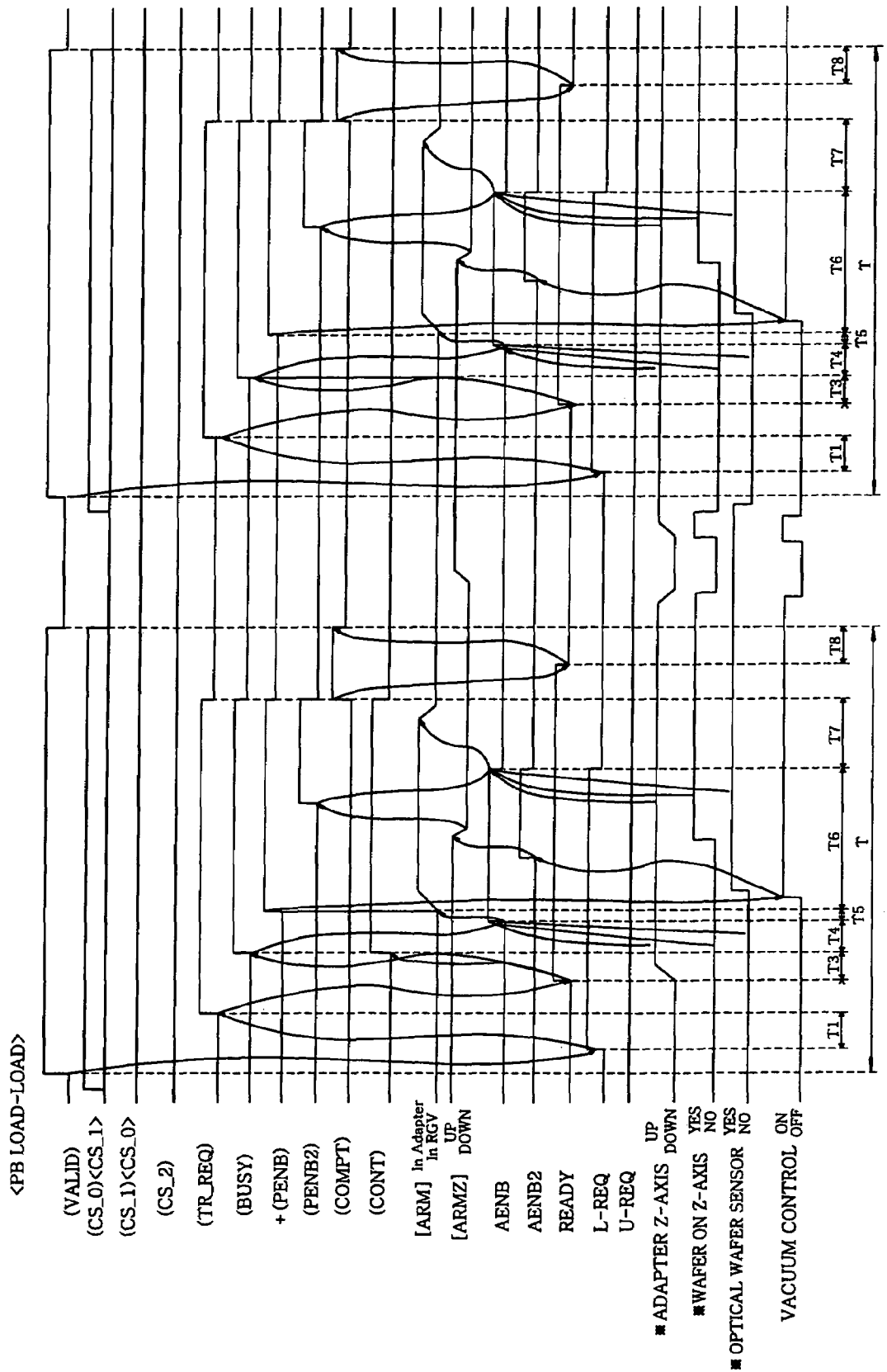
FIG. 5 depicts a timing chart of optical communications employed in a transfer method for transferring objects to be processed in accordance with the first preferred embodiment of the present invention.
Figure 6:
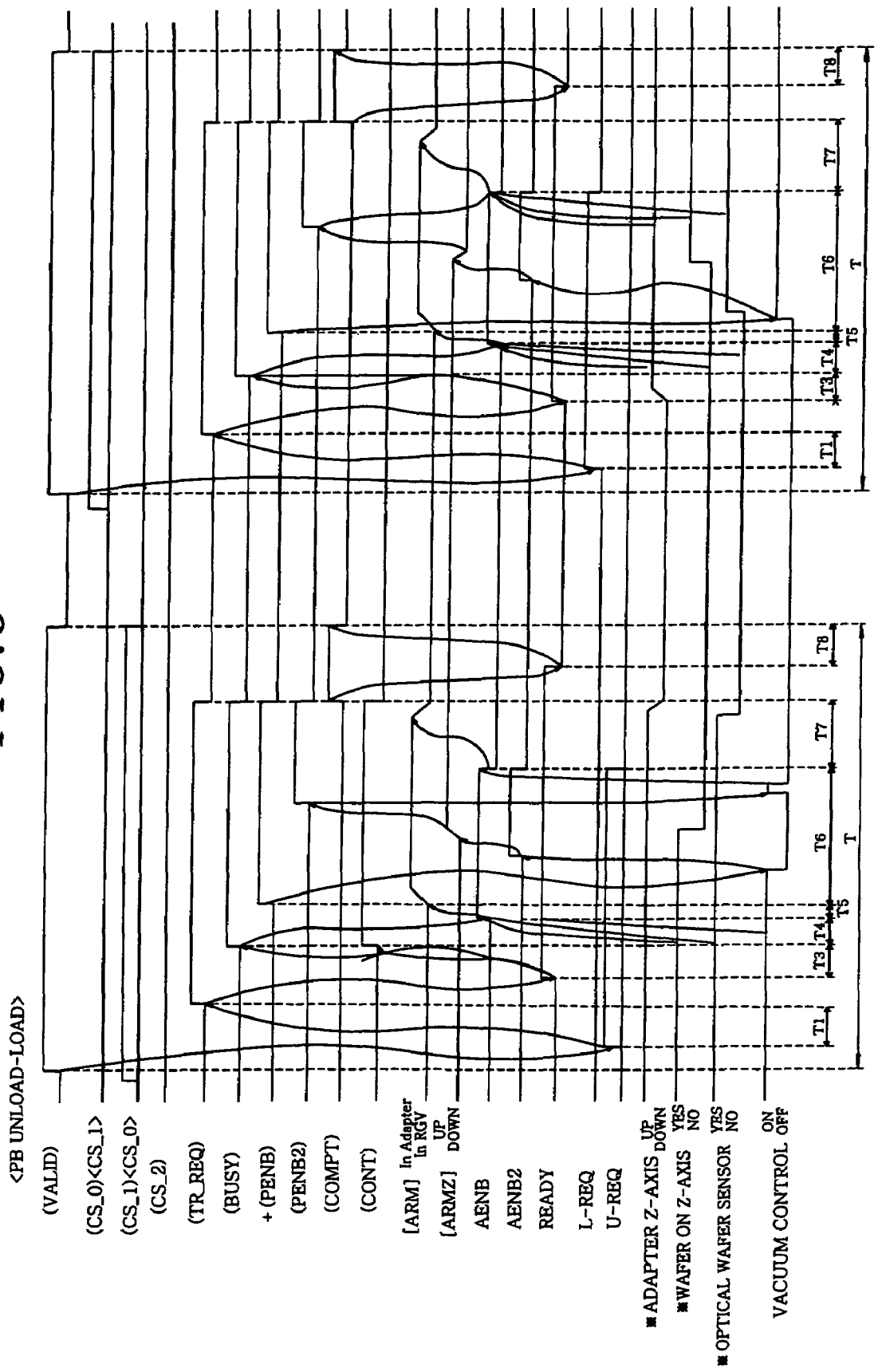
FIG. 6 provides a timing chart of optical communications employed in a transfer method for transferring objects to be processed in accordance with another preferred embodiment of the present invention.
Figure 7:
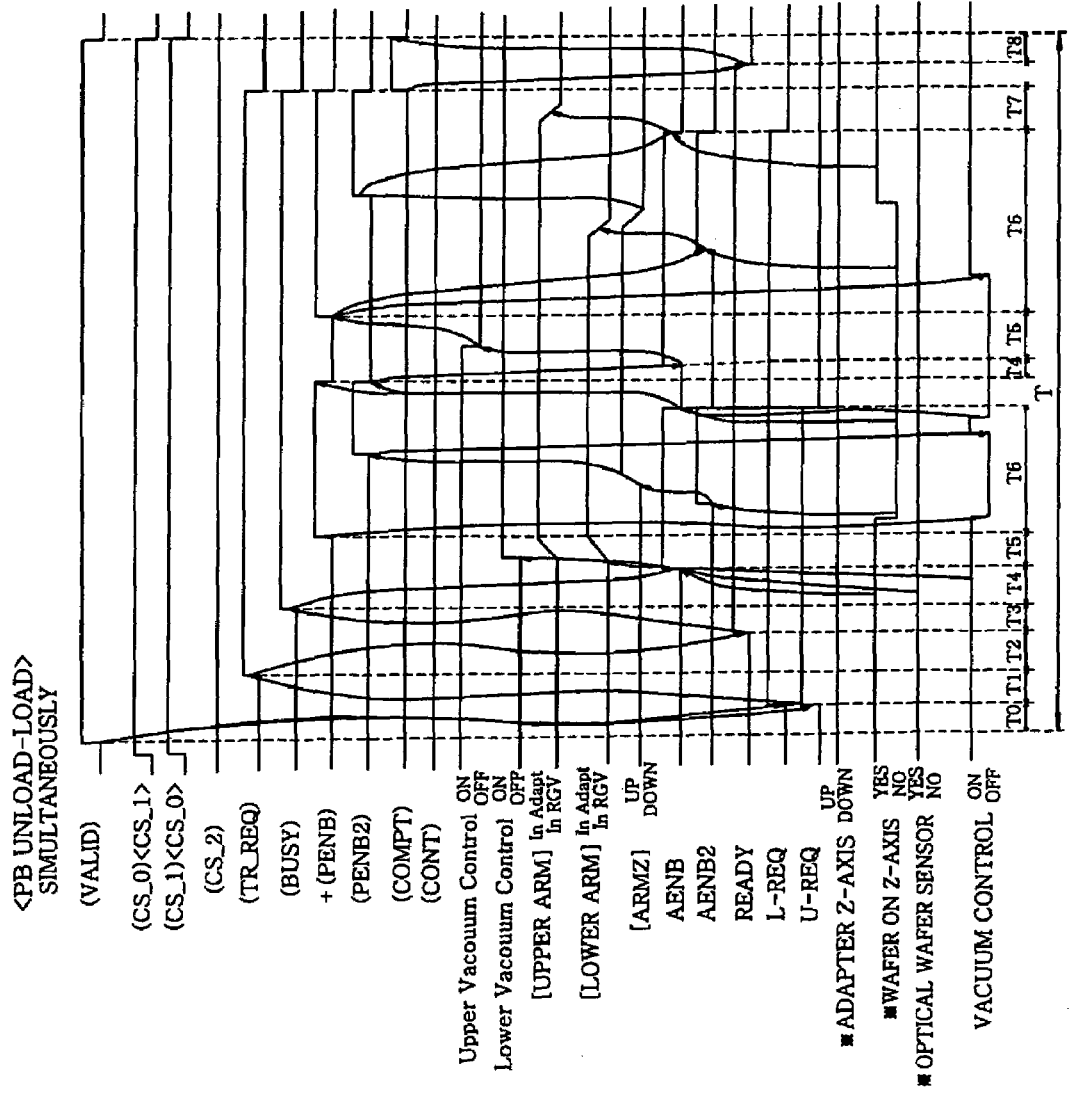
FIG. 7 shows a timing chart of optical communications employed in a transfer method for transferring objects to be processed in accordance with a still another preferred embodiment of the present invention.
Figure 11:
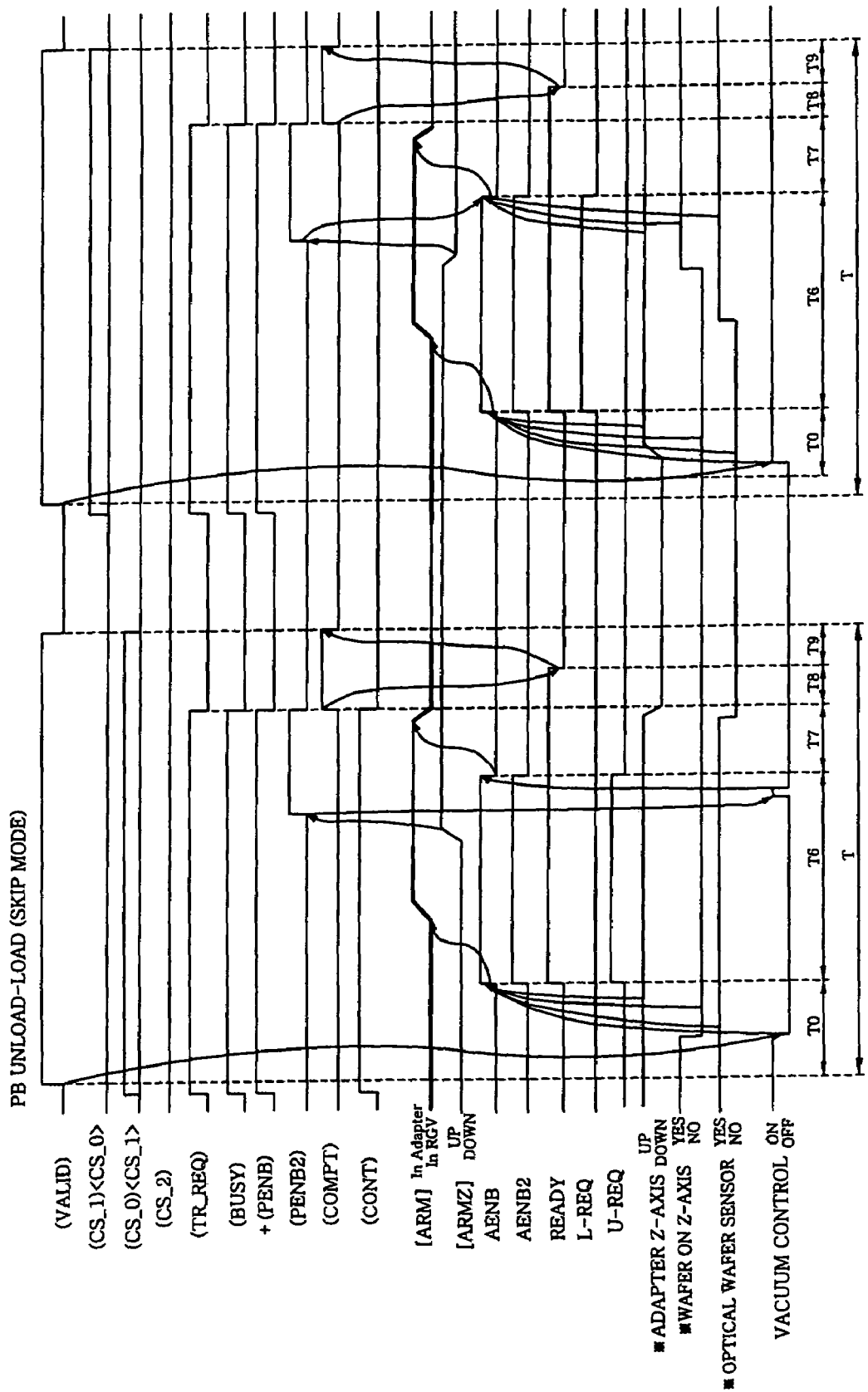
FIG. 11 shows a timing chart of optical communications employed in a transfer method for transferring objects to be processed in accordance with a still another preferred embodiment of the present invention.
Figure 12:
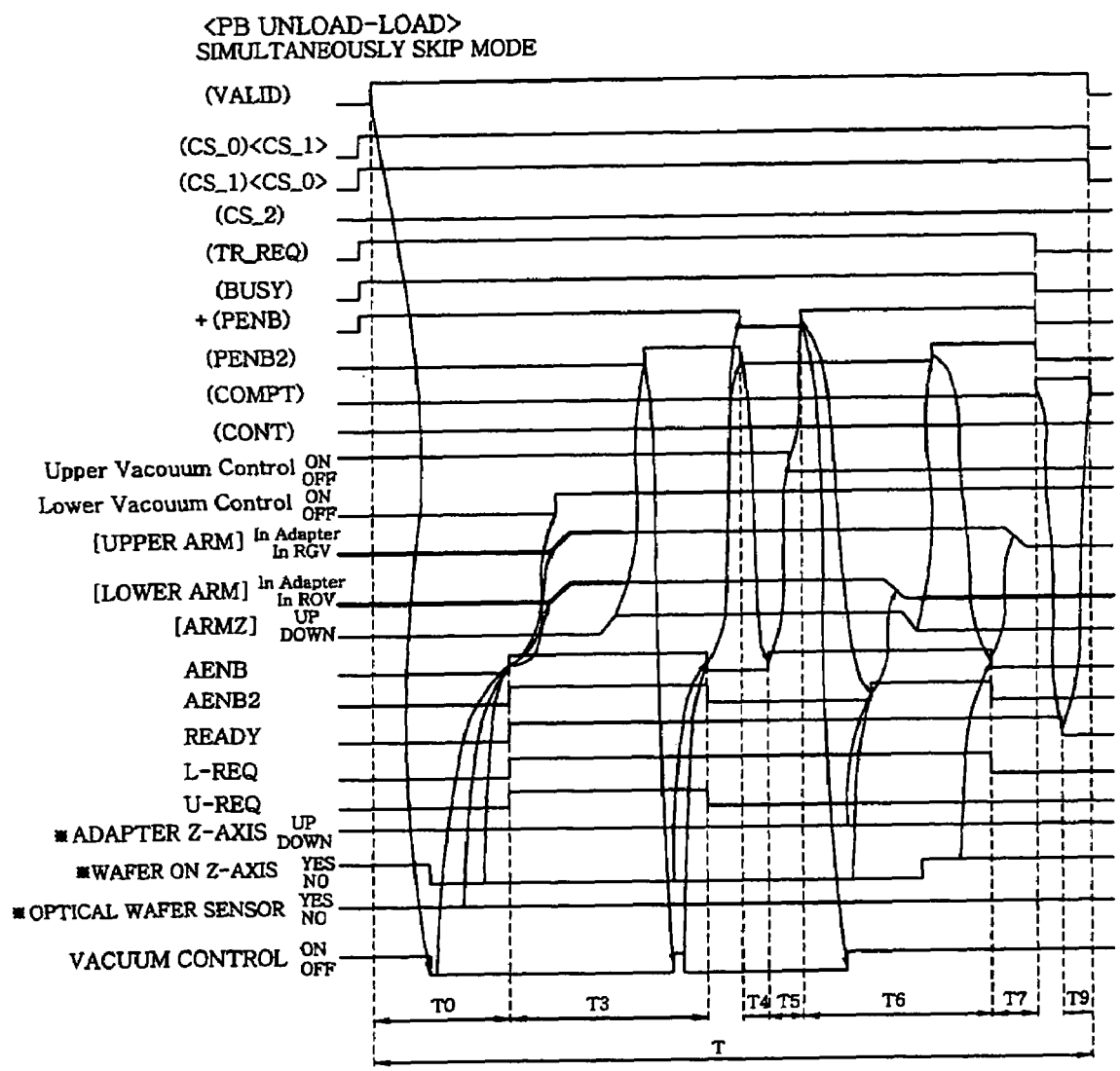
FIG. 12 presents a timing chart of optical communications employed in a transfer method for transferring objects to be processed in accordance with a still another preferred embodiment of the present invention.
Figure 13:
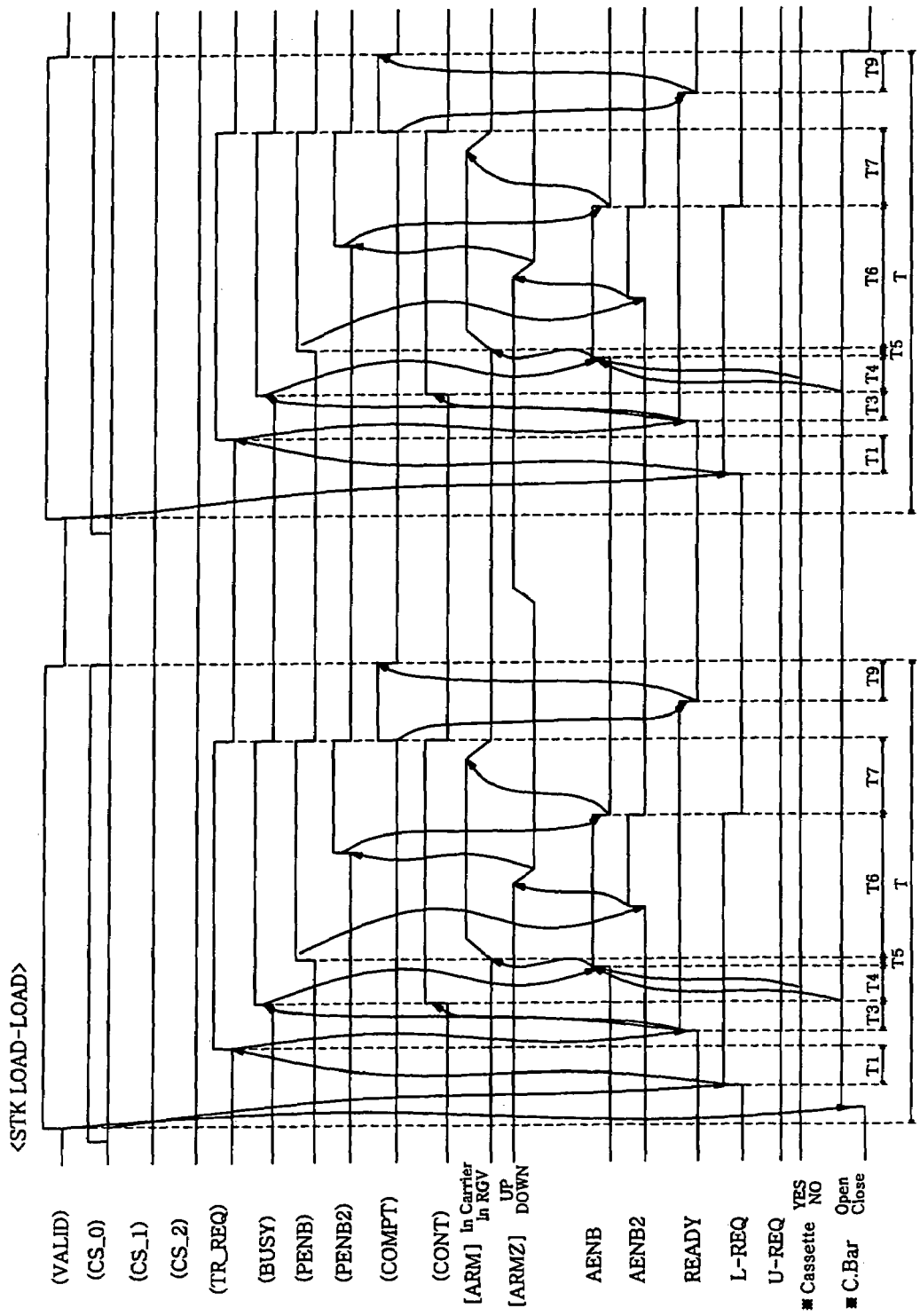
FIG. 13 provides a timing chart of optical communications employed in a transfer method for transferring objects to be processed in accordance with a still another preferred embodiment of the present invention.
Figure 14:
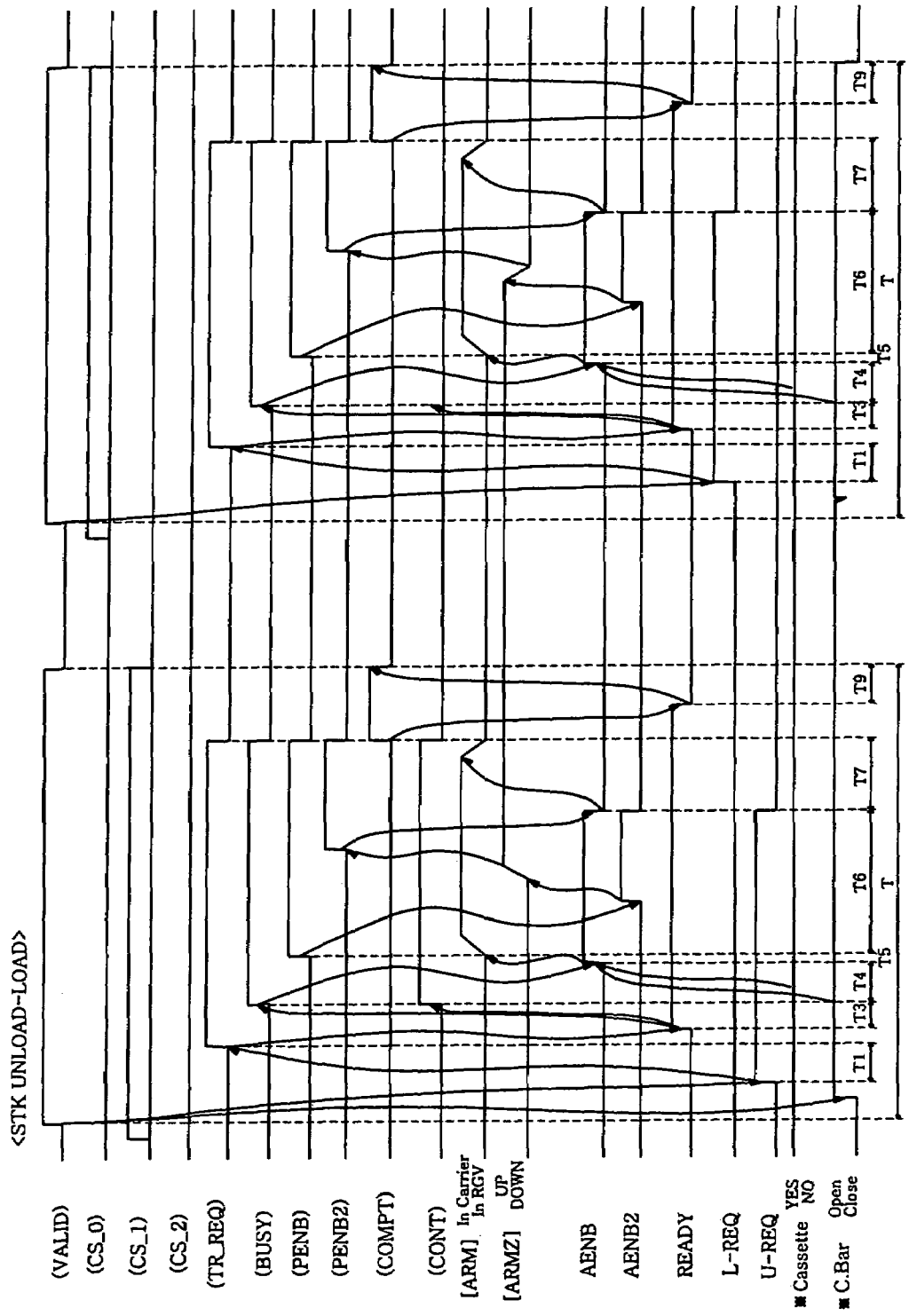
FIG. 14 shows a timing chart of optical communications employed in a transfer method for transferring objects to be processed in accordance with a still another preferred embodiment of the present invention.
Figure 15:
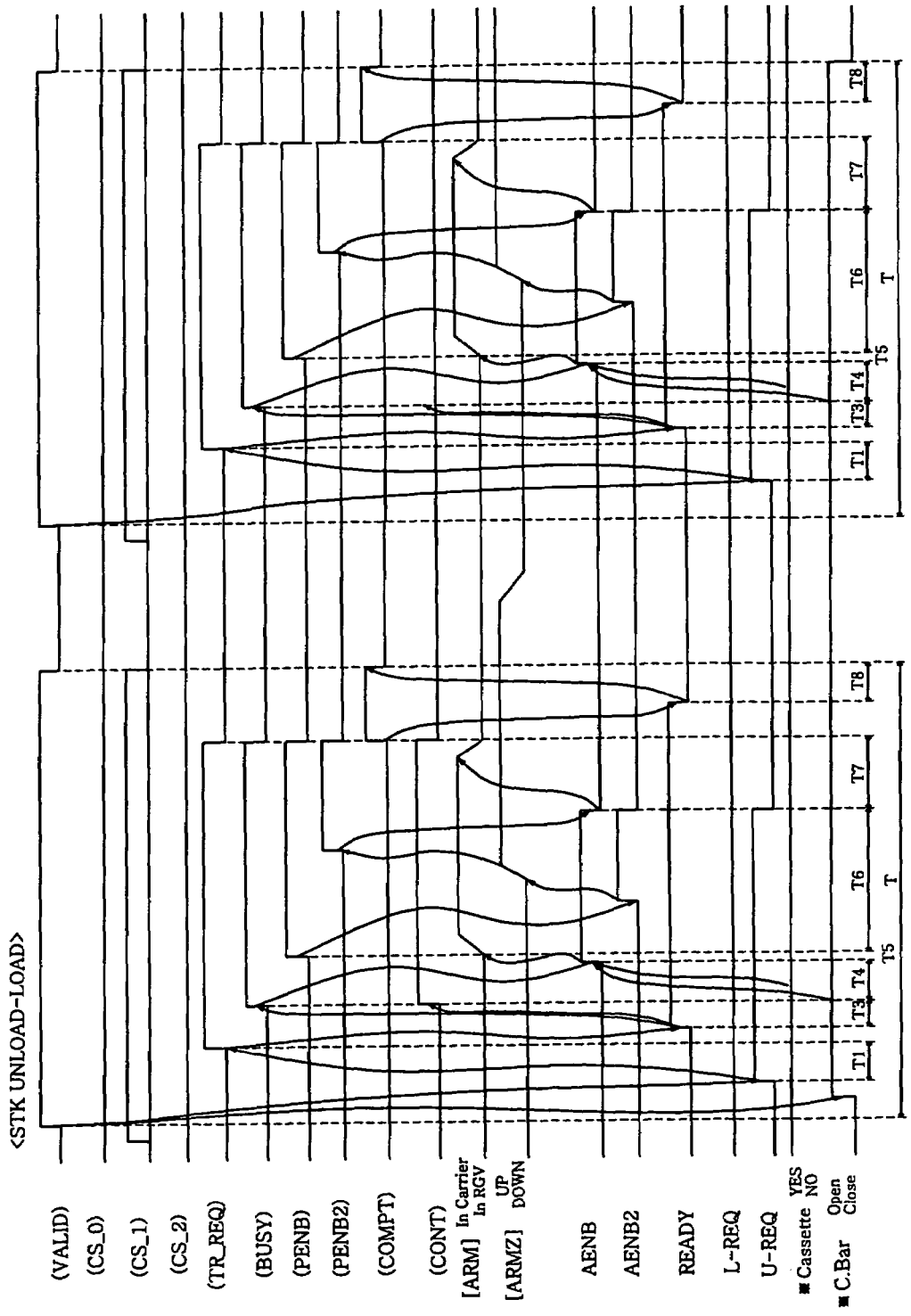
FIG. 15 is a timing chart of optical communications employed in a transfer method for transferring objects to be processed in accordance with a still another preferred embodiment of the present invention.

FIG. 5 shows a timing chart of a transfer method for successively performing the loading of the wafers W between the RGV and the prober; FIG. 6 represents a timing chart of a transfer method for successively performing the unloading and the loading of the wafers W between the RGV and the prober; FIG. 7 shows a timing chart of a transfer method for simultaneously performing the unloading and loading of the wafers W between the RGV and the prober; FIGS. 8 to 12 depict timing charts of transfer methods for transferring the wafer W through communications skipping sequential control signals between the RGV and the prober; and FIGS. 13 to 15 represent timing charts of transfer methods for successively transferring the wafers W between the RGV and the stocker.

First, the transfer method for successively loading the wafers W from the RGV 3 to the prober 2 will be described with reference to FIGS. 1 to 5.

If the host computer 1 transmits a transfer instruction for the wafer W to the RGV controller 4 through the SECS communications line, the RGV 3 moves to the front of the prober 2 (wafer delivery position) under the control of the RGV controller 4. If the RGV 3 arrives at the front of the prober 2, the mapping sensor 33 advances toward the buffer B and the arm mechanism 34 moves up and down. During the movement of the arm mechanism 34, the mapping of the wafers W in the buffer B is performed through the mapping sensor 33. Thereafter, for example, the upper arm 341A (see FIG. 2B) of the arm mechanism 34 moves forward into the buffer B to be positioned at a level slightly below a target wafer W. During this operation, the centering of the wafer w is performed by the upper arm 341A and the buffer B. Next, the wafer W is taken out. By this centering process, the position alignment of the wafer W to the main chuck 26 is automatically performed. For this reason, the wafer W may be directly transferred from the RGV 3 to the main chuck 26.

In the present embodiment, while the sub-chuck 35 rotates after it is elevated to receive the wafer W from the upper arm 341A, the pre-alignment of the wafer W is conducted through the pre-alignment sensor 36. Then, the sub-chuck 35 stops the rotation thereof and moves downwardly, so that the wafer W is returned to the upper arm 341A. During this process, the OCR 37 reads the ID code attached to the wafer W to identify the lot of the wafer W. Thereafter, the arm mechanism 34 is rotated by 90° to align its orientation with the adapter 23 of the prober 2. The ID code of the wafer W identified by the OCR 37 is notified from the RGV 3 to the host computer 1 via the RGV controller 4 and also from the host computer 1 to the prober 2.

Subsequently, the PIO communications are initiated between the RGV 3 and the prober 2 through the PIO communications interfaces 11A and 11B, as shown in the timing chart of FIG. 5. At first, the RGV 3 transmits a CS_0 signal of high level and a CS_1 signal of low level, and then a VALID signal of high level to the prober 2, as depicted in FIG. 5. Accordingly, the load mode becomes valid. Here, the CS_0 signal of high level instructs the loading of the wafer W, while the CS_1 signal of high level instructs the unloading of the wafer W. In the transfer method of FIG. 5, since only the loading is performed, the CS_1 signal is set to a low level. If the CS_0 signal is at the high level as described above, the VALID signal is kept at the high level and it is checked whether or not the adapter 23 of the prober 2 is in a condition where it can receive the wafer W.

If the prober 2 receives the VALID signal, it notifies the RGV 3 that the loading is possible by transmitting an L_REQ signal of high level thereto as shown in FIG. 5. Further, in FIG. 5, signals in brackets <> are for the stocker 10, and those signals are not related with the transfer of the wafer W to and from the prober 2.

If the RGV 3 receives the L_REQ signal as shown in FIG. 5, it notifies the prober 2 that the transfer of the wafer W thereto is possible by transmitting a TR_REQ signal of high level to the prober 2 in order to initiate the loading of the wafer W.

If the prober 2 receives the TR_REQ signal, it notifies the RGV 3 that the adapter 23 is accessible by transmitting a READY signal of high level to the RGV 3. Further, in the prober 2, the sub-chuck 231 (represented as "ADAPTER Z-AXIS" in FIGS. 5 to 15) of the adapter 23 moves up to wait for the wafer W.

If the RGV 3 receives the READY signal from the prober 2, as shown in FIG. 5, it notifies the prober 2 of an initiation of the transfer of the wafer W thereto by transmitting a BUSY signal of high level to the prober 2. Further, the RGV 3 informs the prober 2 of a successive transfer mode by transmitting a CONT signal of high level to the prober 2 simultaneously with the transmission of the BUSY signal. The CONT signal represents that two wafers W are successively transferred to the prober 2, that is, uninspected wafers W are successively transferred to the prober 2, or an inspected wafer W is transferred from the prober 2 to the RGV 3 and then an uninspected wafer W is transferred from the RGV 3 to the prober 2.

If the prober 2 recognizes the transfer initiation by receiving the BUSY signal, it notifies the RGV 3 that it is accessible by the arm mechanism 34 by transmitting an AENB signal of high level thereto. When the prober 2 receives the BUSY signal of high level from the RGV 3, the AENB signal is transmitted from the prober 2 to the RGV 3. That is, upon a loading of the wafer W, the AENB signal of high level indicates a state where the sub-chuck 231 of the adapter 23 is placed at a raised position without holding any wafer W so that it can receive a wafer W; and, upon an unloading of the wafer W, the AENB signal of high level indicates a state where the sub-chuck 231 is placed at a raised position while holding a wafer W so that it can unload the wafer W. Further, upon the loading of the wafer W, the AENB signal of low level indicates a state where the sub-chuck 231 of the adapter 23 detects the wafer W to confirm the loading of the wafer W; and, upon the unloading of the wafer W, the AENB signal of low level indicates a state where the wafer is not detected by the sub-chuck 231.

When receiving the AENB signal of high level, as depicted in FIG. 5, the RGV 3 initiates the loading of the wafer W. Namely, the arm mechanism 34 moves into the adapter 23 of the prober 2 to carry the wafer W to a position just above the sub-chuck 231 of the adapter 23. Further, the RGV 3 transmits a PENB signal to the prober 2 simultaneously with the movement of the arm mechanism 34 into the adapter 23.

The prober 2 actuates the vacuum adsorption mechanism of the sub-chuck 231 of the adapter 23 in response to the PENB signal of high level and transmits the AENB2 signal of high level to the RGV 3. Here, the PENB signal is for controlling ON/OFF of the vacuum adsorption mechanism of the sub-chuck 231 of the adapter 23. Upon the loading of the wafer W, the PENB signal of low level turns OFF the vacuum adsorption mechanism while the PENB signal of high level turns ON the vacuum adsorption mechanism when the wafer W is released from the arm mechanism 34. The PENB signal is set to a low level after the loading of the wafer W is completed by retreating the arm mechanism 34 to the RGV 3. Further, the AENB2 signal is for driving and controlling the arm mechanism 34 of the RGV 3. Upon loading the wafer W, the AENB2 signal is set to a low level at a time when the wafer W is transferred from the arm mechanism 34 to the sub-chuck 231 of the adapter 23 by releasing the vacuum adsorption mechanism simultaneously with a downward movement of the arm mechanism 34.

The RGV 3 notifies the prober 2 of the completion of the transfer by transmitting a PENB2 signal of high level to the prober 2 at the time when the wafer W is transferred to the sub-chuck 231 of the adapter 23 after completing the lowering of the arm mechanism 34 based on the AENB2 signal of high level from the prober 2. The PENB2 signal indicates the completion of the transfer of the wafer W; and, upon the loading of the wafer W, it represents the completion of the transfer of the wafer W from the arm mechanism 34 to the adapter 23.

After the prober 2 recognizes the wafer W on the sub-chuck 231 based on the PENB2 signal of high level, it sets each of the AENB signal, the AENB2 signal and the L_REQ signal to a low level and then notifies the RGV 3 that the loading of the wafer W has been completed by transmitting the signals thereto.

In the RGV 3, the arm mechanism 34 is retreated from the adapter 23 to the RGV 3 based on the above notification. If the arm mechanism 34 has been retreated, the RGV 3 sets each of the TR-REQ signal, the BUSY signal, the PENB signal, the PENB2 signal and the CONT signal to a low level and simultaneously sets a COMPT signal to a high level, and then notifies the prober 2 that the arm mechanism 34 has been retreated by transmitting all of the signals thereto.

Based on this notification, as shown in FIG. 5, the prober 2 transmits the READY signal of low level to the RGV 3 to notify that the transfer work of the first wafer W has been completed; and at the same time completes the transfer work of the first wafer W by setting the COMPT signal to a low level.

In the prober 2, the arm mechanism 24 receives the wafer W from the sub-chuck 231 of the adapter 23. The arm mechanism 24 prepares for a next inspection by storing the wafer W in the virtual loading port 23V. During this, there is performed an inspection for electrical characteristics of another wafer W in the prober chamber 22. Further, in case where the wafer W received by the arm mechanism 24 is inspected as it is, the arm mechanism 24 and the sub-chuck 25 cooperate to perform a pre-alignment of the wafer W; and the wafer W is then transferred to the main chuck 26 as shown in FIG. 2A and the wafer W is aligned through the alignment mechanism 27. Thereafter, the electrical characteristics of the wafer W are inspected by electrically contacting the wafer W with the probe 281 of the probe card 28 while index-feeding the main chuck 26.

As described above, after completing the transfer of the wafer W from the sub-chuck 231 to the arm mechanism 24 in the prober 2, a next loading process is initiated in the RGV 3 by taking out a second wafer W from the buffer B based on the CONT signal. That is, the transfer of the second wafer W is performed in a same sequence as that of the first wafer W between the RGV 3 and the prober 2. If the arm mechanism 24 receives the second wafer W in a same manner as the first wafer W, the second wafer W is stored in the virtual loading port 23V in response to a demand.

Alternatively, in the RGV 3, a plurality of wafers W may be simultaneously taken out from the buffer B by a plurality of arms.

If the electrical characteristic inspection for the wafer W has been completed in the prober 2, the arm mechanism 24 moves to the main chuck 26 to pick up the inspected wafer W, and stores it on the sub-chuck 231 of the adapter 23 or in the virtual loading port 23V. Thereafter, the RGV 3 moves to the front of the prober 2 under the control of the RGV controller 4. If the RGV 3 is positioned to face the prober 2, the adapter 23 initiates to transfer the wafer W to the RGV 3.

As described above, in accordance with the present embodiment, the two wafers W are successively Loaded from the RGV 3 to the prober 2 by sequentially controlling the adapter 23 and the arm mechanism 34 depending on the operation status of the prober 2 by using the optical communications via the PIO communications interfaces 11A and 11B. Accordingly, the transfer efficiency can be improved by shortening the transfer distance and the transfer time of the RGV 3, and further the production efficiency can be increased by reducing TAT.

In the above-described transfer method, two wafers W are successively loaded. However, in case there is an inspected wafer W in the prober 2, the unloading of the inspected wafer W and the loading of an uninspected wafer W can be successively executed via the PIO communications between the prober 2 and the RGV 3. Therefore, a second transfer method for successively conducting the unloading and the loading will now be described with reference to FIG. 6.

In this transfer method, as shown in the timing chart of FIG. 6, an unloading of a wafer W is first performed, and then a loading of another wafer W is conducted. In case of unloading the wafer W, as shown in FIG. 6, the RGV 3 moves towards the front of a predetermined prober 2 in response to an instruction from the RGV controller 4 and transmits a CS_0 signal of low level (a signal to instruct the loading) and a CS_1 signal of high level (a signal to instruct the unloading) and then a VALID signal to the prober 2. Accordingly, the unload mode becomes valid.

If the prober 2 receives the VALID signal, it notifies the RGV 3 that the wafer W is to be unloaded by transmitting a U_REQ signal of high level thereto, as depicted in FIG. 6.

The RGV 3 notifies the prober 2 that the transfer of the wafer W therebetween 2 is possible by transmitting a TR_REQ signal of high level thereto based on the U_REQ signal, as shown in FIG. 6.

The prober 2 notifies the RGV 3 that it is accessible by transmitting a READY signal of high level thereto based on the TR_REQ signal.

If the RGV 3 receives the READY signal, it transmits a BUSY signal of high level and a CONT signal of high level to the prober 2. Accordingly, the prober 2 and the RGV 3 operate at a successive transfer mode wherein the unloading and the loading are successively performed. And, based on the CS_1 signal of high level, the unloading is conducted before the loading.

The prober 2 notifies the RGV 3 that the unloading is possible by transmitting an AENB signal of high level thereto based on the BUSY signal of high level, as shown in FIG. 6.

Based on the notification, in the RGV 3, the arm mechanism 34 moves into the adapter 23. And then, the RGV 3 informs the prober 2 that the unloading is possible by transmitting the PENB signal of high level thereto.

The prober 2 releases the vacuum adsorption mechanism of the sub-chuck 231 positioned at the raised position based on the PENB signal, and then notifies the RGV 3 that the unloading is possible by transmitting an AENB2-signal of high level thereto.

In the RGV 3, based on the AENB2 signal of high level, the arm mechanism 34 moves upwardly and the arm thereof vacuum-adsorbs the wafer W to unload it from the sub-chuck 231. If the unloading of the wafer W by the arm mechanism 34 is completed, the RGV 3 notifies the prober 2 that the wafer W has been unloaded by transmitting a PENB2 signal of high level thereto. For the case of unloading, the PENB2 signal of high level indicates that the unloading of the wafer W from the adapter 23 to the arm mechanism 34 has been completed.

If the prober 2 receives the PENB2 signal of high level, it checks whether or not the wafer W is present on the sub-chuck 231 by actuating the vacuum adsorption mechanism of the sub-chuck 231 of the adapter 23 based on the very signal, as shown in FIG. 6. The vacuum adsorption mechanism is turned OFF as soon as the checking operation is completed. If it is confirmed by the checking operation that the wafer W is removed from the sub-chuck 231, the prober 2 notifies the RGV 3 of the confirmation that the unloading of the wafer W has been completed by setting each of the AENB signal, the AENB2 signal and the U_REQ signal to a low level and transmitting them to the RGV 3.

Based on this notification, in the RGV 3, the arm mechanism 34 is retreated from the adapter 23 to the RGV 3.

If the arm mechanism 34 has been retreated, the RGV 3 sets each of the TR_REQ signal, the BUSY signal, the PENB signal and the PENB2 signal to a low level and simultaneously sets the COMPT signal to a high level, as illustrated in FIG. 6. Then, it notifies the prober 2 that the arm mechanism 34 has been retreated by transmitting those signals thereto.

Based on this notification, the prober 2 sets the READY signal to a low level and transmits it to the RGV 3.

In response to this signal, the RGV 3 sets each of the CS_1 signal and the VALID signal to a low level and completes the unloading work of the wafer W.

When the unloading of the wafer W is completed, in the RGV 3, the arm mechanism 34 returns the unloaded wafer W to the original place in the buffer B and at the same time takes out an uninspected wafer W from the buffer B to be ready to load the uninspected wafer W. If the RGV 3 and the prober 2 are ready for the loading, the wafer W is loaded from the RGV 3 to the adapter 23 of the prober 2 by the same sequential control as in the above-described loading operations.

In accordance with this embodiment as mentioned above, the unloading of the wafer W from the prober 2 to the RGV 3 and the loading of the wafer W from the RGV 3 to the prober 2 can be successively performed by sequentially controlling the adapter 23 and the arm mechanism 34 depending on the operation status of the prober 2 by using the optical communications through the PIO communications interfaces 11A and 11B. Thus, the transfer efficiency can be improved by shortening the transfer distance and the transfer time of the RGV 3, and further the production efficiency can be increased by reducing TAT.

Hereinafter, with reference to FIG. 7, there will be described a third transfer method for performing the unloading and the loading simultaneously.

In this transfer method, as shown in the timing chart of FIG. 7, if the PIO communications between the RGV 3 and the prober 2 is started, the RGV 3 notifies the prober 2 that the unloading and the loading are to be simultaneously performed by transmitting a CS_0 signal of high level and a CS_1 signal of high level at the same time and then a VALID signal to the prober 2. Thus, the simultaneous transfer mode becomes valid.

If the prober 2 receives the VALID signal, it notifies the RGV 3 that an unloading of an inspected wafer W and a loading of an uninspected wafer W are to be simultaneously carried out by setting each of a U_REQ signal and an L_REQ signal to a high level and then transmitting them to the RGV 3, as shown in FIG. 7.

If the RGV 3 receives both of the U_REQ signal and the L_REQ signal at the same time, it notifies the prober 2 that it is ready to transfer the uninspected wafer W to the prober 2 by transmitting a TR_REQ signal of high level thereto, as shown in FIG. 7.

Based on the TR_REQ signal, the prober 2 notifies the RGV 3 that it is accessible by transmitting a READY signal of high level thereto.

If the RGV 3 receives the READY signal, it transmits a BUSY signal of high level to the prober 2.

In response to the BUSY signal of high level, the prober 2 notifies the RGV 3 that the transfer of the wafer W is possible by transmitting an AENB signal of high level thereto, as depicted in FIG. 7.

Based on this notification, in the RGV 3, the upper and the lower arm 341A and 341B of the arm mechanism 34 move into the adapter 23 simultaneously, and the vacuum adsorption mechanism of the lower arm 341B is actuated so that the inspected wafer W can be unloaded by the lower arm 341B. At this time, the upper arm 341A of the arm mechanism 34 holds the uninspected wafer W to be loaded through the vacuum adsorption mechanism. Subsequently, the RGV 3 notifies the prober 2 that the unloading of the inspected wafer W is possible by transmitting a PENB signal of high level thereto.

In response to the PENB signal, the prober 2 makes the wafer W be unloadable by releasing the vacuum adsorption mechanism of the sub-chuck 231 at the raised position, and then notifies the RGV 3 that the unloading is possible by transmitting an AENB2 signal of high level thereto.

In the RGV 3, the arm mechanism 34 is elevated based on the AENB2 signal of high level so that the lower arm 341B thereof receives the wafer W from the sub-chuck 231 by vacuum-adsorbing the wafer W. If the unloading of the wafer W by the arm mechanism 34 is completed, the RGV 3 notifies the prober 2 that the wafer W has been unloaded by transmitting a PENB2 signal of high level thereto.

If the prober 2 receives the PENB2 signal of high level, it checks whether or not the wafer W is present on the sub-chuck 231 by actuating the vacuum adsorption mechanism of the sub-chuck of the adapter 23 based on the very signal, as shown in FIG. 7. The vacuum adsorption mechanism is turned OFF immediately after the above checking process is completed. If it is confirmed by this checking process that the wafer W is removed from the sub-chuck 231, the prober 2 notifies the RGV 3 that the unloading of the wafer W has been completed by setting each of the AENB signal, the AENB2 signal and the U_REQ signal to a low level and transmitting them to the RGV 3.

The RGV 3 sets each of the PENB signal and the PENB2 signal to a low level and transmits them to the prober 2, as illustrated in FIG. 7.

The prober 2 sets the AENB signal to the high level again and then transmits it to the RGV 3.

Based on the AENB signal of high level, the RGV 3 makes the uninspected wafer W loadable by releasing the vacuum adsorption mechanism of the upper arm 341A of the arm mechanism 34. After the vacuum adsorption mechanism of the upper arm 341A has been released, the RGV 3 converts the PENB signal from the low level to the high level, and then notifies the prober 2 that it can access thereto by transmitting the converted signal thereto.

After confirming that there is no wafer W present on the sub-chuck 231 by actuating the vacuum adsorption mechanism of the sub-chuck 231 of the adapter 23 again based on the PENB signal of high level, the prober 2 sets the AENB2 signal to the high level again and transmits it to the RGV 3.

In the RGV 3, the arm mechanism 34 is lowered while retreating the lower arm 341B of the arm mechanism 34 (holding the unloaded wafer W) from the prober 2 to the RGV 3 based on the AENB2 signal of high level, as shown in FIG. 7. After the wafer W is transferred from the upper arm 341 to the sub-chuck 231 by lowering the arm mechanism 34, the PENB2 signal is converted from the low level to the high level and the converted signal is transmitted to the prober 2.

Based on the PENB2 signal of high level, the prober 2 converts each of the AENB signal, the AENB2 signal and the L_REQ signal from a high level to a low level, and then notifies the RGV 3 of the completion of the loading by transmitting the converted signals thereto.

In the RGV 3, the upper arm 341A is retreated from the prober 2 to the RGV 3 based on those signals.

Thereafter, the RGV 3 notifies the prober 2 of the retreat of the arms by transmitting a COMPT signal of high level thereto as shown in FIG. 7.

Based on this notification, the prober 2 transmits a READY signal of low level to the RGV 3.

Based on the READY signal of low level, the RGV 3 completes the unloading and the loading of the wafers W by setting each of the CS_0 signal, the CS_1 signal, the VALID signal and the COMPT signal to a low level.

As described above, in accordance with the present embodiment, the unloading and the loading of the wafers W can be successively executed by sequentially controlling the adapter 23 and the arm mechanism 34 based on the inspection status of the prober 2 by the optical communications via the PIO communications interfaces 11A and 11B, without retreating the arm mechanism 34 from the prober 2. Accordingly, the transfer efficiency can be improved by further shortening the transfer distance and the transfer time; and moreover, the production efficiency can be increased by reducing TAT.

Hereinafter, a transfer method capable of shortening the communications time between the prober 2 and the RGV 3 will be described with reference to FIGS. 8 to 12. In the transfer method shown in FIGS. 8 to 12, since the transmission of a plurality of sequential control signals from the RGV 3 to the prober 2 is made at once, the communications time can be shortened. This communications mode is defined as a skip mode.

Figure 8:
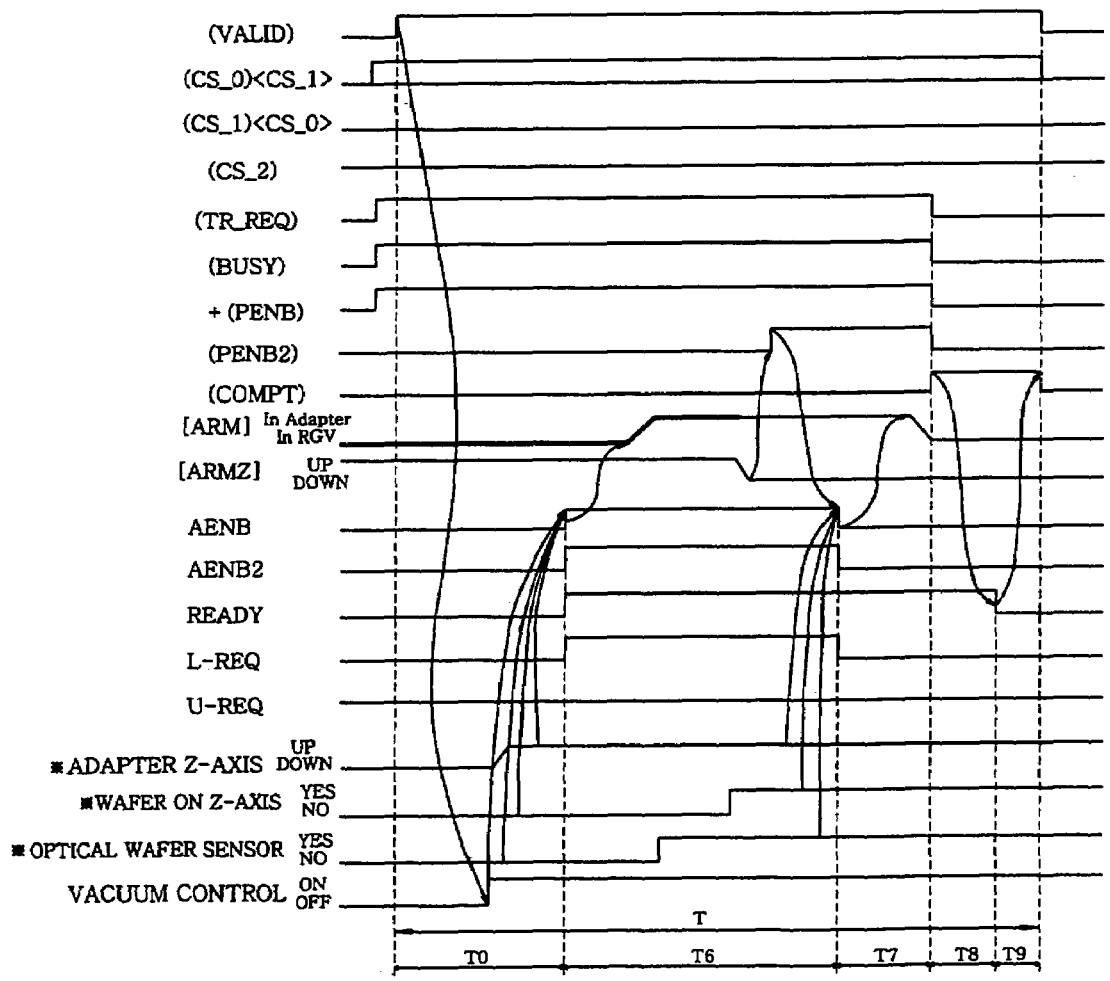
FIG. 8 presents a timing chart of optical communications employed in a transfer method for transferring objects to be processed in accordance with a still another preferred embodiment of the present invention.

The timing chart of FIG. 8 corresponds to a case where the wafer W is loaded. In this case, if the communications between the RGV 3 and the prober 2 are initiated, the RGV 3 notifies the prober 2 that the wafer W is to be loaded by setting each of the CS_0 signal, the TR_REQ signal, the BUSY signal and the PENB signal to a high level and transmitting these signals to the prober 2 at the same time; and then transmits the VALID signal to the prober 2. Thus, the load mode becomes valid.

If the RGV 3 transmits simultaneously all of the CS_0 signal, the TR_REQ signal, the BUSY signal and the PENB signal excluding the PENB2 signal, these signals become valid in the prober 2. Accordingly, the RGV 3 can load the wafer W to the prober 2 without waiting for response signals to the respective signals from the prober 2, so that the communications time can be shortened by, e.g., 940 msec or more per one loading work.

If the prober 2 receives the VALID signal, all of the CS_0 signal, the TR_REQ signal, the BUSY signal and the PENB signal become valid in the prober 2. Further, if the prober 2 receives the VALID signal, the vacuum adsorption mechanism of the sub-chuck 231 of the adapter 23 is actuated, and thereafter, the prober 2 sets each of an AENB signal, an AENB2 signal, a READY signal and an L_REQ signal to a high level and transmits them to the RGV 3 simultaneously, as shown in FIG. 8.

In the RGV 3, the arm mechanism 34 is moved into the adapter 23 of the prober 2 from the RGV 3 and is lowered to transfer the wafer W to the sub-chuck 231 of the adapter 23. After the transfer of the wafer W is completed, the RGV 3 transmits a PENB2 signal of high level to the prober 2.

Based on the PENB2 signal of high level, the prober 2 converts all of the AENB signal, the AENB2 signal, the READY signal and the L_REQ signal to a low level, and then notifies the RGV 3 of the completion of the loading by transmitting these signals thereto. In the RGV 3, the arm mechanism 34 is retreated from the adapter 23 to the RGV 3 based on these signals.

Thereafter, the RGV 3 notifies the prober 2 of the retreat of the arm by transmitting a COMPT signal of high level thereto, as shown in FIG. 8.

Based on this notification, the prober 2 sets the READY signal to a low level and transmits it to the RGV 3.

The RGV 3 completes the loading work of the wafer W by converting each of the CS_0 signal, the VALID signal and the COMPT signal to a low level based on the READY signal of low level.

In accordance with the present embodiment, as described above, by applying the communications using the skip mode in the case where the wafer W is loaded from the RGV 3 to the prober 2 in the method for transferring objects to be processed proposed in Japanese Patent Laid-open Publication No. 2002-217263 by the inventors, the communications time between the RGV 3 and the prober 2 is shortened, the communications efficiency is increased and TAT is further reduced, thereby improving the production efficiency.

Figure 9:
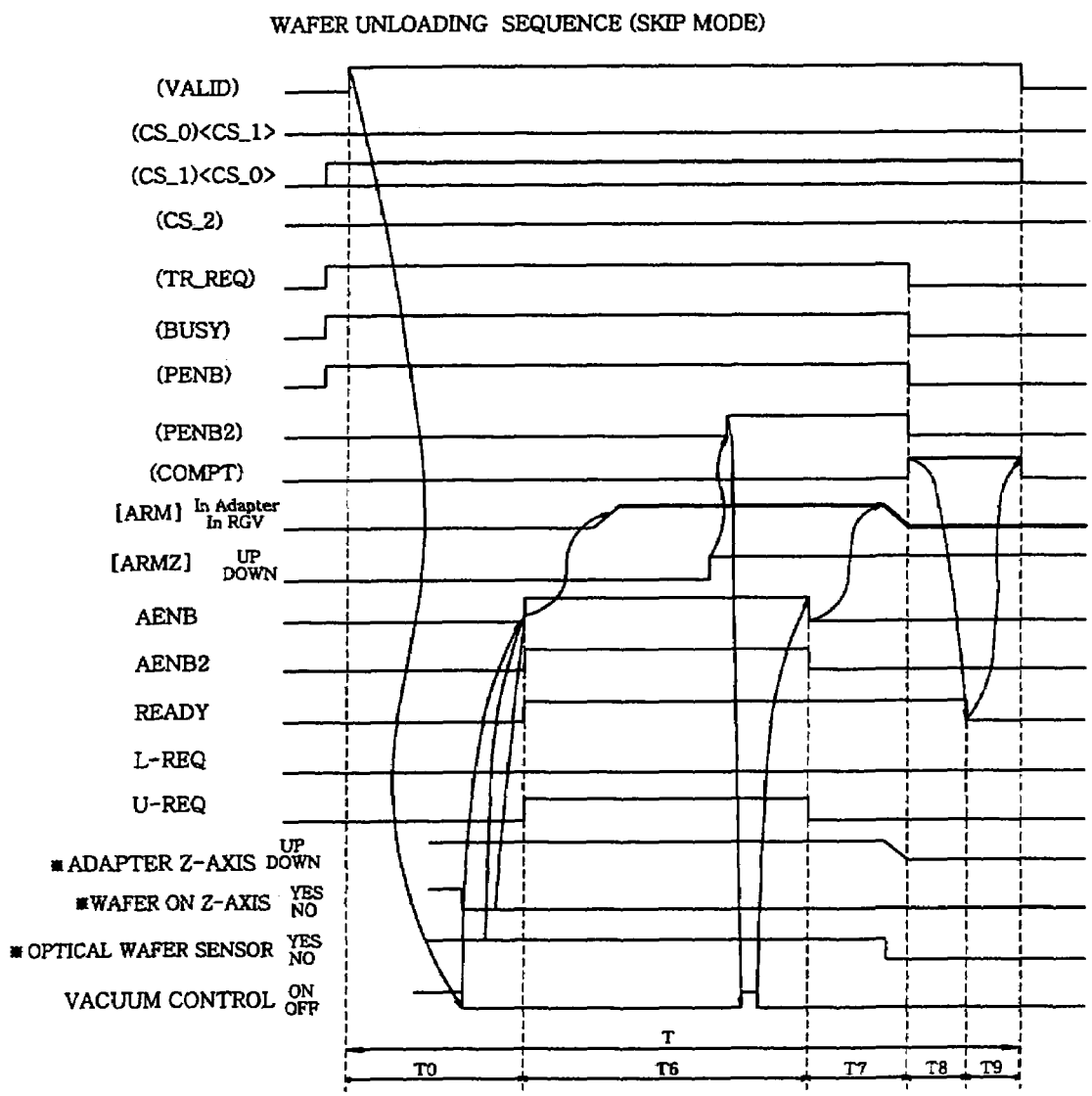
FIG. 9 offers a timing chart of optical communications employed in a transfer method for transferring objects to be processed in accordance with a still another preferred embodiment of the present invention.

Further, the timing chart of FIG. 9 corresponds to a case where the wafer W is unloaded. In case of this skip mode, if the communications between the RGV 3 and the prober 2 are started, the RGV 3 notifies the prober 2 that the wafer W is to be unloaded by setting each of a CS_1 signal, a TR_REQ signal, a BUSY signal and a PENB signal to a high level and transmitting them to the prober 2 simultaneously, and then transmits a VALID signal to the prober 2. Thus, the unload mode becomes valid.

Like the above-described loading case, if the RGV 3 transmits all of the CS_1 signal, the TR_REQ signal, the BUSY signal and the PENB signal excluding a PENB2 signal to the prober 2 simultaneously, these signals become valid in the prober 2. Accordingly, the RGV 3 can unload the wafer W, without waiting for response signals to the respective signals from the prober 2.

Namely, if the prober 2 receives the VALID signal, all of the CS_1 signal, the TR_REQ signal, the BUSY signal and the PENB signal become valid. Further, if the prober 2 receives the VALID signal, the sub-chuck 231 of the adapter 23 is converted into an unloadable state by releasing the vacuum adsorption mechanism at the raised position. Thereafter, the prober 2 sets each of an AENB signal, an AENB2 signal, a READY signal and a U_REQ signal to a high level and transmits them to the RGV 3 simultaneously, as depicted in FIG. 9.

Accordingly, in the RGV 3, the arm mechanism 34 moves into the adapter 23 of the prober 2 from the RGV 3 and then moves upwardly to receive the wafer W from the sub-chuck 231 of the adapter 23. After receiving the wafer W, the RGV 3 transmits a PENB2 signal of high level to the prober 2.

The prober 2 checks whether or not the wafer W is present on the sub-chuck 231 by actuating the vacuum adsorption mechanism of the sub-chuck 231 of the adapter based on the PENB2 of high level. At this time, the prober 2 sets all of the AENB signal, the AENB2 signal and the U_REQ signal to a low level if it is confirmed that no wafer W is present thereon; and then notifies the RGV 3 of the completion of the unloading by transmitting the signals thereto. In the RGV 3, the arm mechanism 34 is retreated from the adapter 23 to the RGV 3 based on the signals.

Thereafter, the RGV 3 converts the PENB2 signal from a high level to a low level and at the same time the COMPT signal to a high level, as shown in FIG. 9, and then transmits the converted signals to the prober 2 to notify the retreat of the arm.

The prober 2 sets the READY signal to a low level and transmits it to the RGV 3.

The RGV 3 converts each of the CS_1 signal, the VALID signal and the COMPT signal to a low level based on the READY signal of low level and completes the unloading work of the wafer W.

As described above, in accordance with the present embodiment, by applying the communications using the skip mode in the case where the wafer W is unloaded from the prober 2 to the RGV 3 in the method for transferring objects to be processed proposed in Japanese Patent Laid-open Publication No. 2002-217263 by the inventors, the communications time between the RGV 3 and the probe 2 is shortened, the communications efficiency is increased, and TAT is further reduced, thereby improving the production efficiency.

Figure 10:
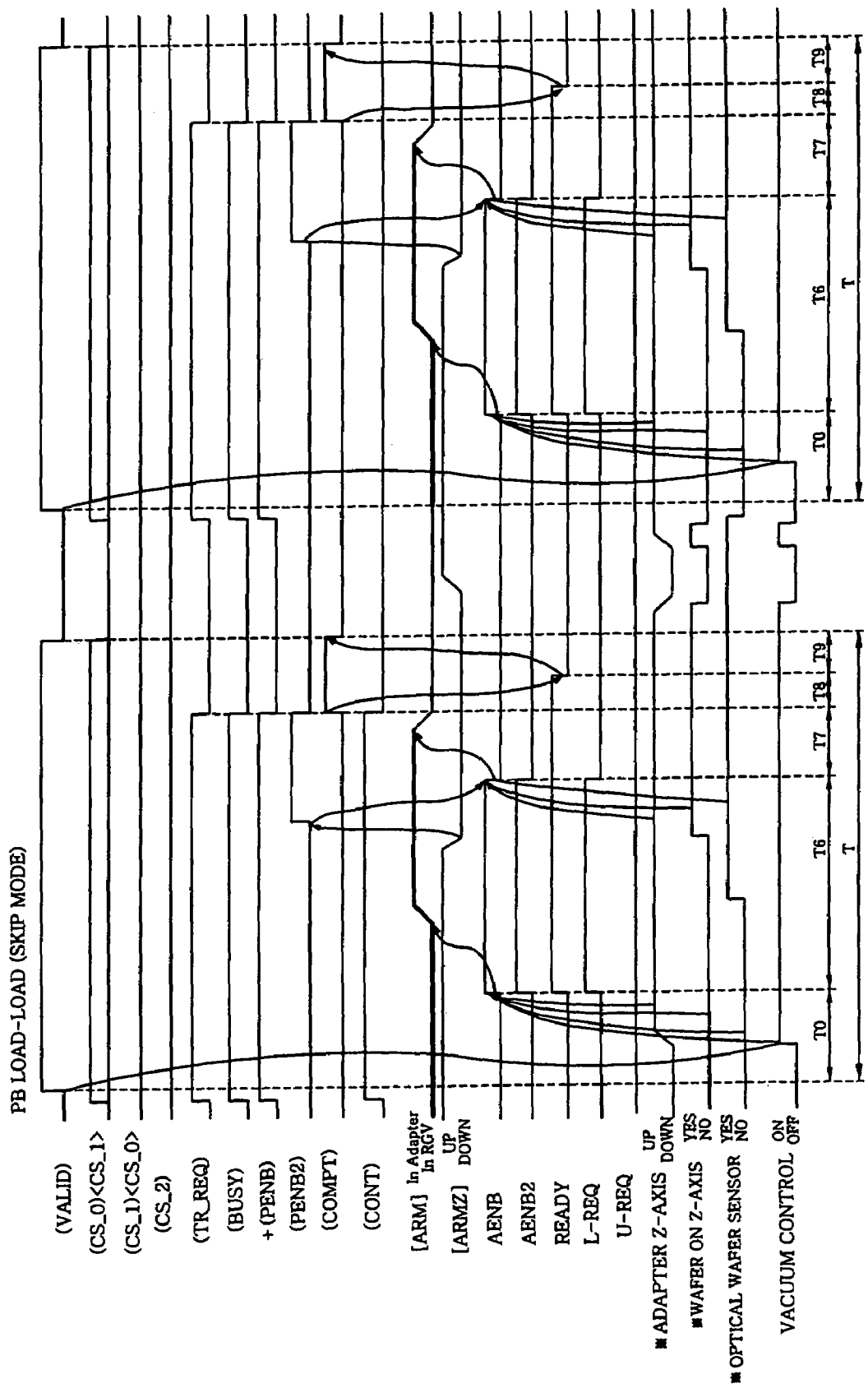
FIG. 10 represents a timing chart of optical communications employed in a transfer method for transferring objects to be processed in accordance with a still another preferred embodiment of the present invention.

Furthermore, as illustrated in FIG. 10, the skip mode may be also applied to a case where the wafers W are successively loaded. This case may be conducted by successively performing the transfer method, as shown in FIG. 8, by using the CONT signal. Further, this skip mode may be also applied to a case where the wafers W are successively unloaded and loaded, as depicted in FIG. 11, or a case where the wafers W are simultaneously unloaded and loaded, as shown in FIG. 12. In accordance with these transfer methods, two wafers W can be successively loaded from the RGV 3 to the prober 2 by sequentially controlling the adapter 23 and the arm mechanism 34 for a shorter communications time based on the operation status of the prober 2 by the optical communications of the skip mode via the PIO communications interfaces 11A and 11B. Accordingly, the transfer efficiency can be increased by reducing the transfer distance and the transfer time of the RGV 3, and moreover, the production efficiency can be improved by reducing TAT.

Moreover, in each of the above embodiments, although the description is made with respect to the cases of loading and unloading the wafer W between the RGV 3 and the prober 2, the transfer method of each embodiment may be also applied to a transfer in other semiconductor handling equipments, for example, a transfer between the RGV 3 and the stocker 10 as illustrated in FIGS. 13 to 15.

FIG. 13 represents a timing chart of a case where the wafers are successively loaded to the stocker; FIG. 14 represents a timing chart of a case where the wafers are successively unloaded and loaded with respect to the stocker; and FIG. 15 represents a timing chart where the wafers are successively unloaded and unloaded with respect to the stocker. Further, although not shown in FIGS. 1A and 4, by providing the stocker with the IPO communications interface same as that of the prober 2, the following communications are performed between the PIO communications interface of the stocker and the PIO communications interface of the RGV 3.

As shown in the timing chart of FIG. 13, the PIO communications are initiated between the RGV 3 and the stocker via the PIO communications interfaces. At first, the RGV 3 transmits a CS_0 signal of high level and then a VALID signal of high level to the stocker, as depicted in FIG. 13. Hence, the load mode becomes valid.

If the stocker 10 receives the VALID signal, it is converted into a loadable state by opening a bar of the stocker 10, and notifies the RGV 3 of the loadable state by transmitting an L_REQ signal of high level thereto, as shown in FIG. 13.

If the RGV 3 receives the L_REQ signal, it notifies the stocker 10 that the wafer W can be transferred to the stocker 10 by transmitting a TR_REQ signal of high level thereto, as shown in FIG. 13.

If the stocker 10 receives the TR_REQ signal, it notifies the RGV 3 that the stocker 10 is accessible by transmitting a READY signal of high level to the RGV 3.

If the RGV 3 receives the READY signal from the stocker 10, it notifies the stocker 10 that the transfer of the wafer W to the stocker 10 is initiated by transmitting a BUSY signal of high level to the stocker 10, as shown in FIG. 13. Further, the RGV 3 notifies the stocker 10 that it is in a successive transfer mode by transmitting a CONT signal of high level to the stocker 10 simultaneously with the BUSY signal.

Once the stocker 10 recognizes the initiation of the transfer by receiving the BUSY signal, it notifies the RGV 3 that it is accessible by the arm mechanism 34 by transmitting an AENB signal of high level to the RGV 3.

When the RGV 3 receives the AENB signal of high level, the arm mechanism 34 moves into a carrier of the stocker 10 and at the same time the RGV 3 transmits a PENB signal of high level to the stocker 10, as depicted in FIG. 13.

The stocker 10 sets the AENB2 signal to a high level based on the PENB signal of high level and transmits it to the RGV 3.

At a time when the lowering operation of the arm mechanism 34 has been completed to transfer the wafer W into the carrier of the stocker 10 based on the AENB2 signal of high level from the stocker 10, the RGV 3 notifies the stocker 10 of the completion of the transfer by transmitting a PENB2 signal of high level to the stocker 10.

The stocker 10 notifies the RGV 3 that the loading of the wafer W has been completed by converting each of the AENB signal, the AENB2 signal and the L_REQ signal to a low level based on the PENB2 signal of high level and transmitting the converted signals to the RGV 3.

In the RGV 3, based on this notification, the arm mechanism 34 is retreated from the stocker 34 to the RGV 3. Once the arm mechanism 34 is retreated, the RGV 3 converts each of the TR_REQ signal, the BUSY signal, the PENB signal, the PENB2 signal and the CONT signal to a low level and simultaneously a COMPT signal to a high level. Then, it notifies the stocker 10 that the arm mechanism 34 has been retreated by transmitting each of the signals to the stocker 10.

Based on this notification, the stocker 10 notifies the RGV 3 that the transfer of the first wafer W has been completed by transmitting a READY signal of low level to the RGV 3 and, at the same time, completes the transfer of the first wafer W by converting the COMPT signal into a low level, as illustrated in FIG. 13.

Subsequently, the RGV 3 takes out a second wafer W from the buffer B based on the CONT signal and then starts a next loading process. That is, the second wafer W is loaded from the RGV 3 to the stocker 10 by performing the communications between the RGV 3 and the stocker 10 in the same sequence as that in the loading of the first wafer W.

As described above, in accordance with the present embodiment, the two wafers W can be successively loaded from the RGV 3 to the stocker 10 by sequentially controlling the stocker 10 and the arm mechanism 34 by the optical communications via the PIO communications interfaces between the RGV 3 and the stocker 10. Accordingly, the transfer efficiency can be increased by reducing the transfer distance and the transfer time of the RGV 3, and further the production efficiency can be increased by reducing the TAT.

Next, a method for successively unloading and loading between the RGV 3 and the stocker 10 will be described. In this case, as depicted in FIG. 14, an unloading of a wafer W is first conducted, and then a loading of another wafer W is carried out. In case where the unloading of the wafer W is conducted, the PIO communications between the RGV 3 and the stocker 10 are started, as shown in FIG. 14.

The RGV 3 transmits a CS_1 signal of high level and then a VALID signal to the stocker 10. Hence, the unloading mode becomes valid.

If the stocker 10 receives the VALID signal, as shown in FIG. 14, the bar of the stocker 10 is opened so that it becomes an unloadable state. Then, the stocker 10 notifies the RGV 3 that the wafer W is to be unloaded by transmitting a U_REQ signal of high level thereto.

The RGV 3 notifies the stocker 10 that it can unload the wafer W from the stocker 10 by transmitting a TR_REQ signal of high level thereto based on the U_REQ signal, as shown in FIG. 14.

The stocker 10 notifies the RGV 3 that it is accessible by transmitting a READY signal of high level to the RGV 3 based on the TR_REQ signal.

If the RGV 3 receives the READY signal, it sets a BUSY signal to a high level and simultaneously a CONT signal to a high level, and then transmits both of the signals to the stocker 10. Accordingly, the stocker 10 and the RGV 3 are converted into successive transfer modes to carry out an unloading and a loading successively.

The stocker 10 notifies the RGV 3 that an unloading is possible by transmitting an AENB signal of high level to the RGV 3 based on the BUSY signal of high level, as shown in FIG. 14.

Based on this notification, in the RGV 3, the arm mechanism 34 moves into the carrier of the stocker 10. And then, the RGV 3 notifies the stocker 10 that the unloading is possible by transmitting a PENB signal of high level to the stocker 10.

The stocker 10 notifies the RGV 3 that the unloading is possible by transmitting an AENB2 signal of high level to the RGV 3 based on the PENB signal.

In the RGV 3, the wafer W is unloaded from the carrier of the stocker 10 by elevating the arm mechanism 34 based on the AENB2 signal of high level. If the unloading of the wafer W by the arm mechanism 34 is completed, the RGV 3 notifies the stocker 10 that the wafer W has been unloaded by transmitting a PENB2 signal of high level to the stocker 10.

The stocker 10 sets each of the AENB signal, the AENB2 signal and the U_REQ signal to a low level based on the PENB2 signal of high level, as shown in FIG. 14, and transmits each of the signals to the RGV 3 to notify the RGV 3 of the completion of confirming the unloading of the wafer W.

Based on this notification, in the RGV 3, the arm mechanism 34 is retreated from the stocker 10 to the RGV 3.

Once the arm mechanism 34 is retreated, as shown in FIG. 14, the RGV 3 sets each of the TR_REQ signal, the BUSY signal, the PENB signal and the PENB2 signal to a low level and simultaneously a COMPT signal to a high level, and then notifies the stocker 10 of the retreat of the arm mechanism 34 by transmitting these signals to the stocker 10.

Based on this notification, the stocker 10 transmits a READY signal of low level to the RGV 3.

Based on this signal, the RGV 3 converts each of the CS_1 signal and the VALID signal to a low level and completes the unloading work of the wafer W. The unloaded wafer W is accommodated in the buffer of the RGV 3.

Subsequently, the RGV 3 takes out one wafer W from the buffer B based on the CONT signal and initiates the loading process into the stocker 10. In this case, the same sequence as that in the loading shown in FIG. 13 is conducted.

As described above, in accordance with the present embodiment, the transfer of the wafers W can be successively conducted between the RGV 3 and the stocker 10 by sequentially controlling the stocker 10 and the arm mechanism 34 by the optical communications via the PIO communications interfaces between the RGV 3 and the stocker 10. Accordingly, the transfer efficiency can be increased by reducing the transfer distance and the transfer time of the RGV 3, and further, the production efficiency can be improved by reducing TAT.

Furthermore, in accordance with the timing chart shown in FIG. 15, the RGV 3 can successively unload the wafers W from the stocker 10.

Moreover, the present invention is not limited to each of the embodiments, but various modifications may be properly made if necessary. For example, the prober 2 of the present embodiment may conduct the inspection for each carrier, by making a simple change in the loader chamber similarly as in the conventional method. Further, although the prober 2 and the stocker 10 are exemplified as the semiconductor handling equipments in each of the embodiments, the present invention may be widely applied to semiconductor handling equipments including, e.g., a processing apparatus for performing a predetermined process on objects to be processed such as wafers. Furthermore, although in the above-described embodiments, there is no description on the size of the wafer, the present invention may be applied to both cases of wafers having a same size (e.g., 300 mm) and wafers having different sizes (e.g., 300 mm and 200 mm).

Moreover, each of the transfer methods as described above is actually controlled through software (program). The software to control each of the transfer methods is generally stored in a computer-readable storage unit (a storage medium: see FIG. 1A) installed in any one of the above-mentioned hardware elements or connected thereto. The present invention may also be applied to a case where the software is dispersedly stored in a plurality of hardware elements to cooperate with each other during the control thereof, as well as the case where the software is integrated and stored in any one of the above-described hardware elements.

While the present invention has been described with respect to the particular embodiments, it will be apparent to those skilled in the art that various changes and modifications may be made without departing from the spirit and scope of the invention as defined in the following claims.

What is claimed is:

1. A method for transferring objects, which employs a system for transferring an object, the system including:
    a semiconductor handling device provided with a single loading port, a first transfer mechanism having first transfer arms to transfer the objects between the single loading port and a processing unit, and a first optically coupled parallel input/output (I/O) communications interface; and
    an automatic transfer device provided with a second transfer mechanism having second transfer arms and a second optically coupled parallel I/O communications interface,
    wherein the first and the second transfer mechanism are configured to successively transfer the objects one by one to each other via the single loading port, and
    the first and the second optically coupled parallel I/O communications interface transmit and receive therebetween optical signals as control signals to control the first or the second transfer mechanism,
    the method comprising:
    unloading a processed object from a processing unit to the single loading port by the first transfer mechanism;
    holding an unprocessed object by one of the second transfer arms; and
    unloading the processed object from the single loading port by another of the second transfer arms while the unprocessed object is held by said one of the second transfer arms,
    wherein all objects to be processed in the processing unit and all the objects processed in the processing unit are transferred between the first and the second transfer mechanism via the single loading port.

2. A computer-readable storage medium including computer executable instructions, wherein the instructions, when executed by a processor, cause the processor to perform the transfer method described in claim 1.

3. The method according to claim 1, wherein the semiconductor handling device further includes an adapter, the adapter serving as the single loading port.

4. The method according to claim 1, wherein, when unloading the processed object from the single loading port by said another of the second transfer arms while the unprocessed object is held by said one of the second transfer arms, said one and said another of the second transfer arms are moved together into the single loading port simultaneously.

5. The method according to claim 1, wherein an unprocessed object is transferred from the second transfer mechanism to one of the first transfer arms and is held by said one of the first transfer arms when another object is in the processing unit.

6. The method according to claim 1, further comprising:
    a successive transfer notifying step of notifying the automatic transfer device and the semiconductor handling device of a possibility of a successive transfer with each other via an optical communications between the first and the second optically coupled parallel I/O communications interface in case where the objects are able to be successively transferred one by one between the first and the second transfer mechanism.

7. The method according to claim 6, further comprising:
- a transfer initiation notifying step of notifying the semiconductor handling device of a transfer initiation via the optical communications between the first and the second optically coupled parallel I/O communications interface when the successive transfer is initiated, the transfer initiation being provided from the automatic transfer device;
- an access confirming step of checking whether or not the single loading port is accessible by the second transfer mechanism based on a presence or absence of an object in the first transfer mechanism after the transfer initiation notifying step;
- an access confirmation notifying step of notifying the automatic transfer device of the result in the access confirming step via the optical communications between the first and the second optically coupled parallel I/O communications interface, the result in the access confirming step being provided from the semiconductor handling device; and
- an accessing step of operating the second transfer mechanism to access the single loading port based on the result of the access confirming step.

8. A computer-readable storage medium including computer executable instructions, wherein the instructions, when executed by a processor, cause the processor to perform the transfer method described in claim 7.

9. The method according to claim 7, wherein, at the successive transfer notifying step, the automatic transfer device notifies the semiconductor handling device that the successive transfer is possible, and
- the successive transfer notifying step and the transfer initiation notifying step are substantially simultaneously conducted.

10. A computer-readable storage medium including computer executable instructions, wherein the instructions, when executed by a processor, cause the processor to perform the transfer method described in claim 9.

11. The method according to claim 7, further comprising:
- a retreat confirming step of checking whether or not the second transfer mechanism is able to be retreated from the single loading port based on presence or absence of an object in the first transfer mechanism after the accessing step;
- a retreat confirmation notifying step of notifying the automatic transfer device of the result in the retreat confirming step via the optical communications between the first and the second optically coupled parallel I/O communications device, the result in the retreat confirming step being provided from the semiconductor handling device;
- a retreating step of retreating the second transfer mechanism from the single loading port based on the result of the retreat confirming step after the retreat confirmation notifying step; and
- a transfer completion notifying step of notifying the semiconductor handling device of completion of the transfer via the optical communications between the first and the second optically coupled parallel I/O communications interface after the retreating step, the completion of the transfer being provided from the automatic transfer device.

12. A computer-readable storage medium including computer executable instructions, wherein the instructions, when executed by a processor, cause the processor to perform the transfer method described in claim 11.

13. A computer-readable storage medium including computer executable instructions, wherein the instructions, when executed by a processor, cause the processor to perform the transfer method described in claim 6.

* * * * *